US012704470B1

(12) United States Patent
Vinegar et al.

(10) Patent No.: US 12,704,470 B1
(45) Date of Patent: Aug. 11, 2026

(54) ESTIMATION OF PALEO-DEPOSITIONAL CYCLES IN ORGANIC-RICH CHALK BY NMR RESTRICTED DIFFUSION

(71) Applicants: VINEGAR TECHNOLOGIES LLC, West Lake Hills, TX (US); William Marsh Rice University, Houston, TX (US)

(72) Inventors: Eva G. Vinegar, West Lake Hills, TX (US); Xinglin Wang, Houston, TX (US); Yunke Liu, Houston, TX (US); Philip M. Singer, Richmond, TX (US); George J. Hirasaki, Bellaire, TX (US); Harold J. Vinegar, West Lake Hills, TX (US)

(73) Assignee: VINEGAR TECHNOLOGIES LLC, West Lake Hills, TX (US)

( * ) Notice: Subject to any disclaimer, the term of this patent is extended or adjusted under 35 U.S.C. 154(b) by 168 days.

(21) Appl. No.: 18/823,470

(22) Filed: Sep. 3, 2024

Related U.S. Application Data

(60) Provisional application No. 63/536,104, filed on Sep. 1, 2023.

(51) Int. Cl.
*G01N 24/08* (2006.01)
*G01R 33/563* (2006.01)

(52) U.S. Cl.
CPC ..... *G01N 24/081* (2013.01); *G01R 33/56341* (2013.01)

(58) Field of Classification Search
CPC ........................ G01N 24/081; G01R 33/56341
See application file for complete search history.

(56) References Cited

U.S. PATENT DOCUMENTS

| | | | | |
|---|---|---|---|---|
| 6,018,243 | A | 1/2000 | Taicher | |
| 6,163,151 | A | 12/2000 | Wisler | |
| 6,570,382 | B1 * | 5/2003 | Hurlimann | G01N 24/081 324/306 |
| 11,099,292 | B1 | 8/2021 | Vinegar | |
| 11,280,931 | B2 | 3/2022 | Cheng | |
| 11,921,069 | B1 | 3/2024 | Vinegar | |
| 11,933,932 | B1 | 3/2024 | Vinegar | |
| 12,228,531 | B1 | 2/2025 | Singer | |

(Continued)

OTHER PUBLICATIONS

Abed, A.M., 2013, The Eastern Mediterranean Phosphorite Giants: An Interplay Between Tectonics and Upwelling, Geoarabia-Manama, 18(2), 67-94. DOI: 10.2113/geoarabia180267.

(Continued)

*Primary Examiner* — G.M. A. Hyder
(74) *Attorney, Agent, or Firm* — Momentum IP Ltd.; Marc Van Dyke

(57) ABSTRACT

Estimating paleo-depositional cycles in a geological formation is accomplished by obtaining $^1$H nuclear magnetic resonance (NMR) measurements of restricted diffusion of a protonated fluid in a direction perpendicular to a bedding plane in a core sample aligned in the perpendicular direction and removed from the geological formation. Diffusive tortuosity is estimated from the restricted diffusion measurements, and a diffusion length at which the restricted diffusion in the core sample reaches a tortuosity limit is ascertained. An average spacing between sedimentary boundaries of restricted diffusion can then be calculated.

12 Claims, 16 Drawing Sheets

(56) References Cited

U.S. PATENT DOCUMENTS

2004/0090230 A1 5/2004 Appel
2020/0278470 A1 9/2020 Dementyev

OTHER PUBLICATIONS

Almogi-Labin, A., Bein, A., Sass, E., 1993, Late Cretaceous Upwelling System Along the Southern Tethys Margin (Israel): Interrelationship Between Productivity, Bottom Water Environments, and Organic Matter Preservation. Paleoceanography, 8(1993), 671-690. DOI: 10.1029/93PA02197.
Almogi-Labin, A., Flexer, A., Honigstein, A., Rosenfeld, A., Rosenthal, E., 1990, Biostratigraphy and Tectonically Controlled Sedimentation of the Maastrichtian in Israel and Adjacent Countries. Revista Espanola de Paleontologia, 5(1990), 41-52. DOI: 10.7203/sjp.25117.
Carman, P. C., 1997, Fluid flow through granular beds. Process Safety and Environmental Protection: Transactions of the Institution of Chemical Engineers, Part B., 75, S32-S48. DOI: 10.1016/S0263-8762(97)80003-2.
Chen, J.-H., Stacey Althaus, S., Boudjatit, M., 2022, Optimization of NMR Permeability Transform and Application to a Source Rock Reservoir, Paper IPTC-22195-EA, International Petroleum Technology Conference, Riyadh, Saudi Arabia, February. DOI: 10.2523/IPTC-22195-EA.
Chen, Z., Singer, P.M., Wang, X., Hirasaki, G.J., Vinegar, H.J., 2019a, Evaluation of Light Hydrocarbon Composition, Pore Size, and Tortuosity in Organic-Rich Chalks using NMR Core Analysis and Logging, Paper SPWLA-2019-K, SPWLA 60th Annual Logging Symposium, The Woodlands, Texas, USA, Jun. 15-19. DOI: 10.30632/T60ALS-2019_K.
Chen, Z., Singer, P.M., Wang, X., Vinegar, H.J., Nguyen, S.V., Hirasaki, G.J., 2019b, NMR Evaluation of Light-Hydrocarbon Composition, Pore Size, and Tortuosity in Organic-Rich Chalks, Petrophysics, 60 (06), 771-797. DOI: 10.30632/PJV60N6-2019a5.
Co-pending U.S. Appl. No. 18/823,441, filed Sep. 3, 2024 entitled Estimation of Permeability Anisotropy in Organic-Rich Chalk By NMR Restricted Diffusion [same inventor-list as present application].
Co-pending U.S. Appl. No. 18/823,477, filed Sep. 3, 2024 entitled Apparatus for Obtaining NMR Measurements of Restricted Diffusion in Two Orthogonal Directions [same inventor-list as present application].
Coates G.R., Miller, M., Gillen, M., Henderson, C., 1991, The MRIL in Conoco 33-1 an Investigation of aNew Magnetic Resonance Imaging Log, Paper SPWLA-1991-DD, SPWLA 32nd Annual Logging Symposium, Midland, Texas, USA, June.
Cobb, K.M., Westphal, N. Sayani, H.R., Watson, J.T., Di Lorenzo, E., Cheng, H., Edwards, R.L., and Charles, C.D., 2013, Highly Variable El Niño—Southern Oscillation Throughout the Holocene. Science, 339(6115), 67-70. DOI: 10.1126/science.1228246.
Dang, S., Mukherjee, S., Sondergeld, C., Rai, C., 2021, Measurement of Effective Tortuosity in Unconventional Tight Rock using Nuclear Magnetic Resonance, SPE/AAPG/SEG Unconventional Resources Technology Conference, URTEC—2021-5118-MS.
Dullien, F.A.L., 1979, Porous Media Fluid Transport and Pore Structure, Academic Press, ISBN: 978-0122236501.
Elsayed, M., El-Husseiny, A., Kwak, H., Hussaini, S.R., Mahmoud, M., 2021, New Technique for Evaluating Fracture Geometry and Preferential Orientation Using Pulsed Field Gradient Nuclear Magnetic Resonance, Paper SPE-205505-PA, Society of Petroleum Engineers, SPE Journal, 26 (05), 2880-2893. DOI: 10.2118/205505-PA.
Gordin, Y., Bradley, T., Rosenberg, Y.O., Canning, A., Hatzor, Y.H., Vinegar, H.J., 2021, Relating Acoustic Anisotropy to Kerogen Content in Unconventional Formations—A Case Study in a Kerogen-Rich Unconventional Carbonate, Paper SPE-205912-MS, 2021 SPE Annual Technical Conference and Exhibition, Dubai, UAE, Sep. 21-23. DOI: 10.2118/205912-MS.
Hughen, K.A., Schrag, D.P., Jacobsen, S.B., and Hantoro, W., 1999, El Niño During the Last Interglacial Period Recorded by a Fossil Coral from Indonesia. Geophysical Research Letters, 26(20), 3129-3132. DOI: 10.1029/1999GL006062.
Jochum, M., Yeager, S.G., Lindsay, K., Moore, K., and Murtugudde, R., 2010, Quantification of the Feedback Between Phytoplankton and ENSO in the Community Climate System Model. Journal of Climate, 23(11), 2916-2925. DOI: 10.1175/2010JCLI3254.1.
Kenyon, W.E., Day, P.I., Straley, C., Willemsen, J.F., 1988, A three-part study of NMR longitudinal relaxation properties of water-saturated sandstones. SPE-15643-PA, SPE Form Eval, 3(03), 622-636. DOI:10.2118/15643-PA.
Latour, L.L., Mitra, P.P., Kleinberg, R.L., Sotak, C.H., 1993, Time-Dependent Diffusion Coefficient of Fluids in Porous Media as a Probe of Surface-to-Volume Ratio, Journal of Magnetic Resonance, Series A, 101(3), 342-346. DOI: 10.1006/jmra.1993.1056.
Li, Q.; Kortunov, P.; Messner, M.; Ertas, D.; King, H., 2022, Fluid Transport Mechanisms in Unconventional Tight Rocks Based on NMR Imaging, Energy Fuels, 36, 9014-9021.
Liu, Y., Wang, X., Hirasaki, G.J., Vinegar, E.V., Vinegar, H.,G., Singer, P.M., 2023, Separation of Solid and Liquid Components in Organic-Rich Chalks Using NMR Relaxation, Fuel, 333, 126223.
Lo, S., Hirasaki, G.J., House, W.V., Kobayashi, R., 2002, Mixing Rules and Correlations of NMR Relaxation Time with Viscosity, Diffusivity, and Gas/Oil Ratio of Methane/Hydrocarbon Mixtures, SPE Journal, 7(01), 24-34. DOI: 10.2118/77264.
Meilijson. A., Ashckenazi-Polivoda, S., Illner, P., Speijer, R.P., Almogi-Labin, A., Feinstein, S., Puttmann, W., Abramovich, S., 2018, From Phytoplankton to Oil Shale Reservoirs: A 19-Million-Year Record of the Late Cretaceous Tethyan Upwelling Regime in the Levant Basin. Marine and Petroleum Geology, 95(0264-8172), 188-205. DOI: 10.1016/j.marpetgeo.2018.04.012.
Meilijson. A., Ashckenazi-Polivoda, S., Ron-Yankovich, L., Illner, P., Alsenz, H., Speijer, R.P., Almogi-Labin, A., Feinstein, S., Berner, Z., Puttmann, W., Abramovich, S., 2014, Chronostratigraphy of the Upper Cretaceous High Productivity Sequence of the Southern Tethys, Israel. Cretaceous Research, 50(4), 187-213. DOI: 10.1016/j.cretres.2014.04.006.
Scholes, O.N., Clayton, S.A., Hoadley, A.F.A., Tiu, C., 2007, Permeability anisotropy due to consolidation of compressible porous media, Transport in Porous Media, 68, 365-387. DOI: 10.1007/S11242-006-9048-5.
Shute, A., Kampf, J., Doubell, M., Rodriguez, A.R., Moller, L., Baring, R., and Newman, M., 2022, Variability of Surface and Subsurface Phytoplankton Blooms in a Seasonal Coastal Upwelling System. Continental Shelf Research, 246, 104832. DOI: 10.1016/j.csr.2022.104832.
Storebø, E.M., Meireles, L.T.P., Fabricius, I.L., 2022, Permeability Modeling in Clay-Rich Carbonate Reservoir, Petrophysics, 63 (2), 148-171. DOI: 10.30632/PJV63N2-2022a2.
Timur, R., 1969, Pulsed nuclear magnetic resonance studies of porosity, movable fluid, and permeability of sandstones, Paper SPE-2045-PA, Journal of Petroleum Technology, 21(06), 775-786. DOI: 10.2118/2045-PA.
Venkataramanan, L., Song, Y., Hurlimann, M.D., 2002, Solving Fredholm Integrals of the First Kind with Tensor Product Structure in 2 and 2.5 Dimensions, IEEE Transactions on Signal Processing, 50(5), 1017-1026. DOI: 10.1109/78.995059.
Vinegar, E.G., Rosenberg, Y.O., Reznick, I., Gordin, Y., Singer, P.M., Wang, X., Chen, Z., Nguyen, S.V., Li, W., Bradley, T., Hirasaki, G.J., Lake, L.W., Feinstein, S., Hatzor, Y.H., Vinegar, H.J., 2020a, What Happens to the Petrophysical Properties of a Dual Porosity Organic-Rich Chalk During Early-Stage Organic Maturation?, Paper SPWLA-5092, SPWLA 61st Annual Logging Symposium, Virtual Online Webinar, June. DOI: 10.30632/SPWLA-5092.
Wang, X., Singer, P.M., Chen, Z., Hirasaki, G.J., Vinegar, H.J., 2020, A New Method of Estimating Tortuosity and Pore Size in Unconventional Formations using NMR Restricted Diffusion Measurements, Paper SPWLA-5046, SPWLA 61st Annual Logging Symposium, Virtual Online Webinar, June. DOI: 10.30632/SPWLA-5046.
Wang, X., Singer, P.M., Liu, Y., Chen, Z., Hirasaki, G.J., Vinegar, H.J., 2021a, Pore Size, Tortuosity, and Permeability from NMR

(56) References Cited

OTHER PUBLICATIONS

Restricted Diffusion in Organic-Rich Chalks, Petrophysics, 62(3), 244-264. DOI: 10.30632/PJV62N3-2021a1.
Wang, X., Singer, P.M., Liu, Y., Chen, Z., Hirasaki, G.J., Yang, Z. Seltzer, S.J., Sun, B., Wigand, M.O., Burger, J.E., 2021b, Permeability from NMR in the Unconventional Point-Pleasant Formation, Paper JURTEC-2021-5015-MS, SPE/AAPG/SEG Unconventional Resources Technology Conference, Houston, TX, USA, July. DOI: 10.15530/urtec-2021-5015.
Webb, E.J. and Magi, B.T., 2022, The Ensemble Oceanic Nino Index, Int. J. Climatol, 2022; 42:5321-5341. DOI:10.1002/joc.7535.
Zhang, Z., Weller, A., 2021, A comparative study of permeability prediction for Eocene sandstones—Part 1: Application of modified Swanson models to mercury injection capillary pressure and nuclear magnetic resonance data, Geophysics, 86(6), 233-243. DOI: 10.1190/geo2021-0194.1.
Wang, Xinglin, Vinegar, Eva G., Liu, Yunke, Singer, Philip M., Hirasaki, George J., and Harold J. Vinegar. "Estimation of Permeability Anisotropy and Depositional Cycles in Organic-Rich Chalk by NMR Restricted Diffusion." Paper presented at the SPWLA 64th Annual Logging Symposium, Lake Conroe, Texas, USA, Jun. 10, 2023. doi: https://doi.org/10.30632/SPWLA-2023-0095.
Wang, Xinglin, Vinegar, Eva G., Liu, Yunke, Singer, Philip M., Hirasaki, George J., and Harold J. Vinegar. Visual Accompanying Slides-Presentation for Paper SPWLA-2023-0095: "Estimation of Permeability Anisotropy and Depositional Cycles in Organic-Rich Chalk by NMR Restricted Diffusion." Presented at SPWLA 64th Annual Logging Symposium, Lake Conroe, Texas, USA, Jun. 10, 2023.

* cited by examiner $k_{\parallel}$ in horizontal well

ESTIMATION OF PALEO-DEPOSITIONAL CYCLES IN ORGANIC-RICH CHALK BY NMR RESTRICTED DIFFUSION

CROSS-REFERENCE TO RELATED APPLICATIONS

This application claims the benefit of U.S. Provisional Patent Application No. 63/536,104, filed Sep. 1, 2023, entitled "Estimation of permeability anisotropy and depositional cycles in organic-rich chalk by NMR restricted diffusion", which is incorporated herein by reference in its entirety.

FIELD OF THE INVENTION

The invention relates to the field of analyzing geological formations for hydrocarbon exploration, and in particular to obtaining 1H nuclear magnetic resonance (NMR) measurements of restricted diffusion in geological formations.

BACKGROUND

Known techniques for estimating the duration of paleo depositional cycles can include stratigraphic analysis to identify patterns and sequences that indicate different depositional environments and time periods; radiometric dating using techniques such as uranium-lead dating or argon-argon dating; isotope geochemistry of sedimentary rocks; and various analyses of sedimentary strata such as magnetostratigraphy, biostratigraphy, cyclostratigraphy, and stratigraphy. To date, none of the existing techniques, even in combination, have provided a satisfactory level of precision at a reasonable level of expense and complexity.

SUMMARY

A new method is presented for studying permeability anisotropy and paleo-depositional cycles by combining NMR anisotropic restricted diffusion measurements and SEM images on core.

A method is disclosed, according to embodiments, for estimating paleo-depositional cycles in a geological formation. The method comprises: (a) obtaining 1H nuclear magnetic resonance (NMR) measurements of restricted diffusion of a protonated fluid in a direction perpendicular to a bedding plane in a core sample aligned in the perpendicular direction and removed from the geological formation; (b) estimating diffusive tortuosity from the restricted diffusion measurements; (c) ascertaining a diffusion length at which the restricted diffusion in the core sample reaches a tortuosity limit; and (d) calculating an average spacing between sedimentary boundaries of restricted diffusion.

In some embodiments, the method can additionally comprise: estimating a duration of an average paleo-depositional cycle based on the calculated average spacing between sedimentary boundaries of restricted diffusion and an estimated sedimentary depositional rate. In some embodiments, the sedimentary deposition rate can be based on an age-depth plot of the geological formation. In some embodiments, the age-depth plot can be obtained from radioactivity, paleomagnetic and/or bio stratigraphic data obtained from core or well logs.

In some embodiments, the calculating of the average spacing between sedimentary boundaries of restricted diffusion can include multiplying, by a constant, the ascertained diffusion length at which the tortuosity limit is reached. In some embodiments, the constant can be is between 1.5 and 2.5. In some embodiments, the constant can be between 1.8 and 2.2.

In some embodiments, the estimating of diffusive tortuosity can include using a Padé fit.

In some embodiments, the sedimentary boundaries of restricted diffusion can comprise organic-rich layers and/or layers of accumulated shell fragments.

In some embodiments, the method can additionally comprise: comparing the estimated duration of the paleo-depositional cycles to present-day climate cycles.

In some embodiments, the method can additionally comprise: determining a change between the estimated duration of the paleo-depositional cycles to present-day climate cycles. In some embodiments, the present-day climate cycles can be calculated as average of ENSO cycles dating back to 1850.

DETAILED DESCRIPTION OF THE EMBODIMENTS

A fundamental input parameter in reservoir geological models is the permeability anisotropy of the formation, where permeability tends to be smaller perpendicular $k_\perp$ to bedding plane (which is typically in the vertical direction, i.e., 0°) versus parallel $k_\parallel$ to bedding plane (which is typically in the horizontal direction, i.e., 90°), in other words $k_\perp/k_\parallel<1$ typically. The permeability anisotropy parameter $k_\perp/k_\parallel$ depends on rock heterogeneity (e.g., shale laminations) and the degree of compaction (Scholes 2007). A reliable measurement of $k_\perp/k_\parallel$ across the formation is critical for reservoir simulators to optimize hydrocarbon production.

Anisotropy is observed at different length-scales. On the scale of about 100 m, shear-wave seismic anisotropy is often used to determine the "sweet spots" in a basin. On the scale of about 1 m, acoustic logging tools detect transverse anisotropy using Stoneley wave cross-dipole sonic logging. On the scale of 2 cm (core-scale), ultra-sonic measurements have been used to determine shear wave anisotropy. In the organic-rich Golan basin, the transverse anisotropy (TI) from acoustic well logs correlates strongly with the kerogen content (Gordin et al. 2021). The present disclosure extends the anisotropy studies to the μm level in the same formation using NMR and SEM-BSE images.

Figure 1A:
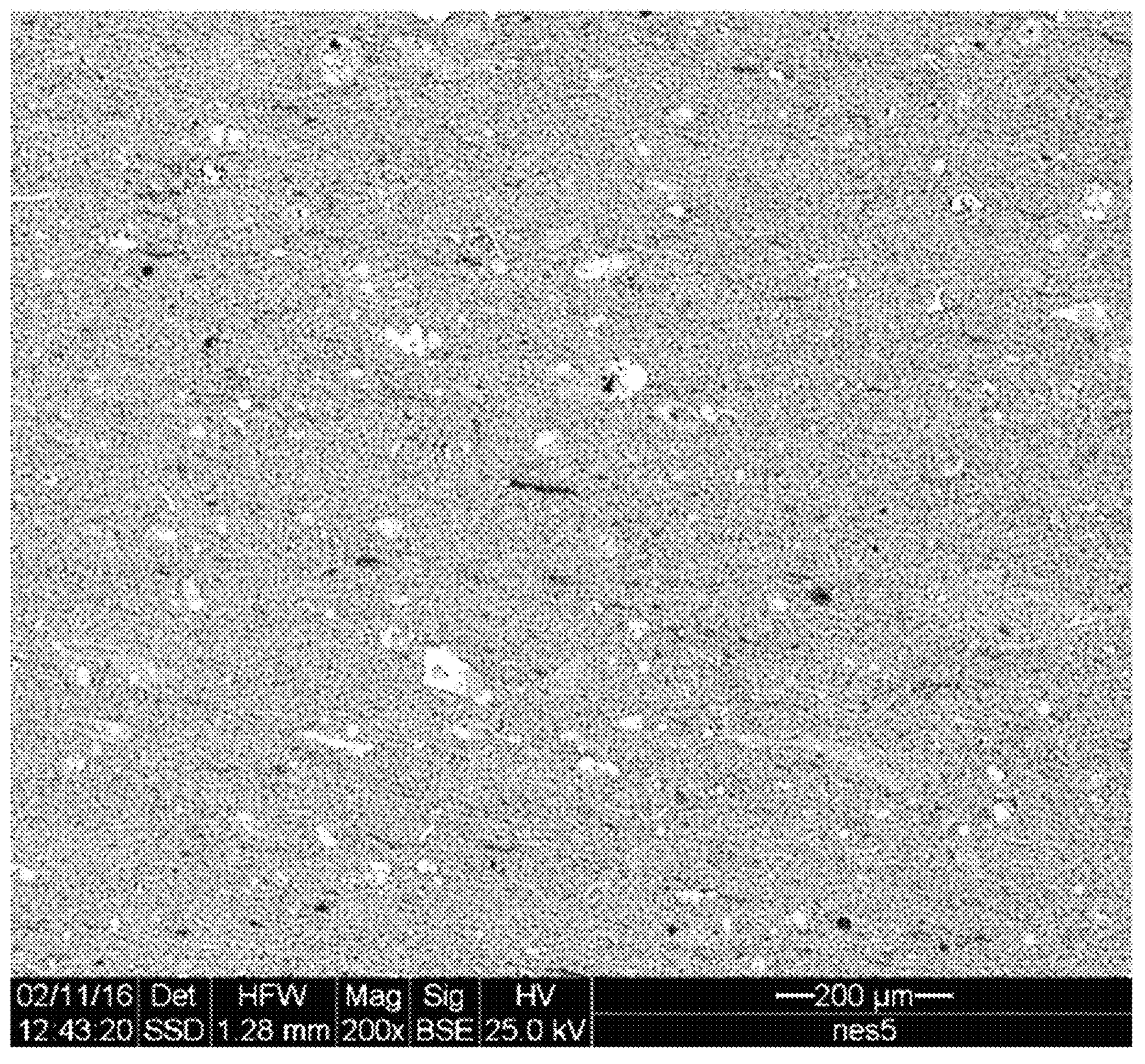
FIGS. 1A and 1B show exemplary SEM-BSE images of a core sample, parallel and perpendicular, respectively, to organic-rich laminations according to embodiments of the present invention.
Figure 1B:
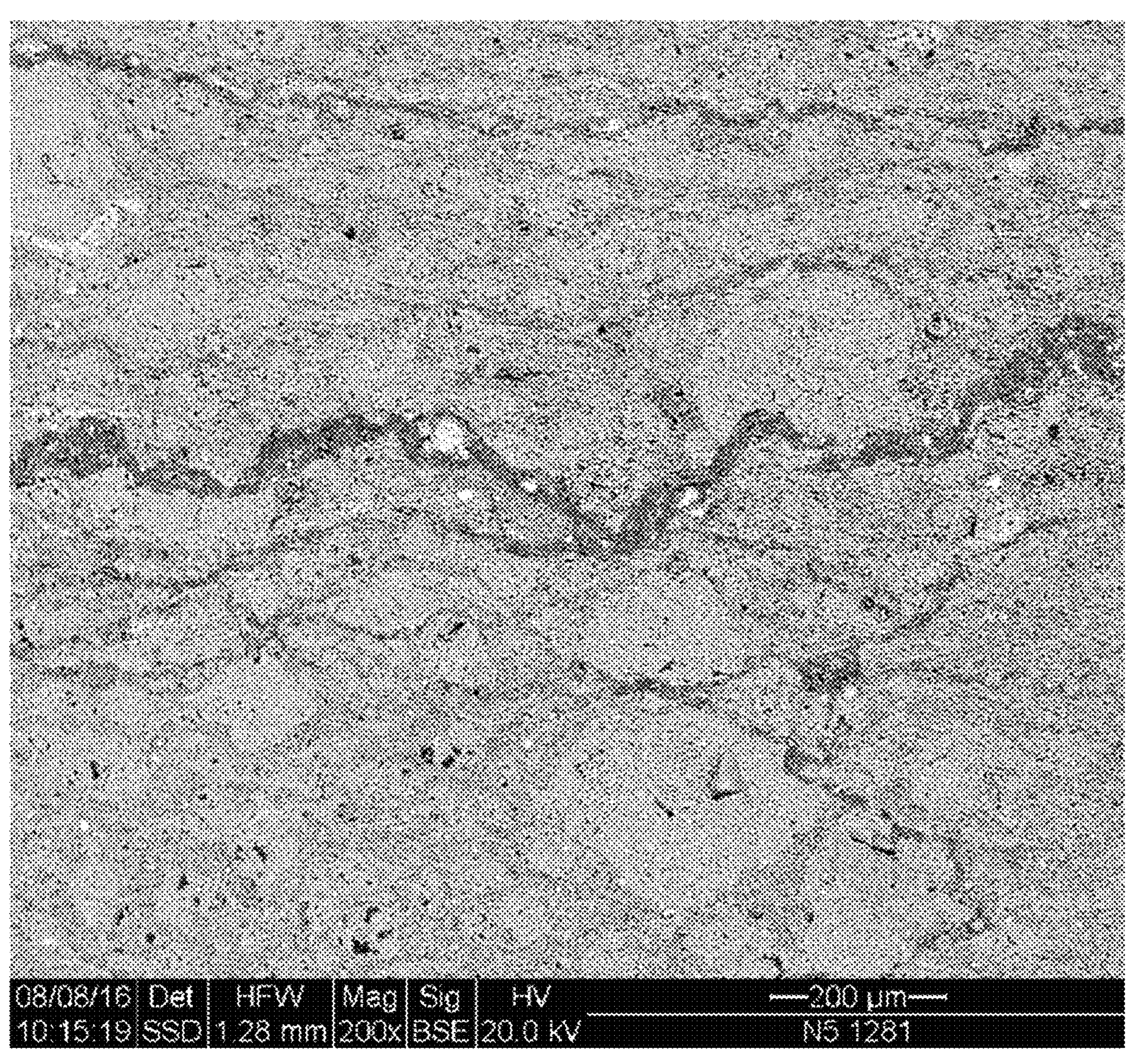

A set of SEM-BSE (Back Scatter) images, shown in FIGS. 1A and 1B, were obtained on samples parallel and perpendicular, respectively, to the organic-rich laminations in the NESS 5 well in the Golan basin. FIG. 1A shows the foraminifera fossils whereas FIG. 1B shows organic-rich laminations with an average spacing of about 200 μm between the organic-rich laminations. Shell fragments are observed between the laminations. Anisotropy is evident comparing the two orientations. The organic-rich laminations act to restrict fluid transport in the vertical direction relative to the horizontal direction. The BSE images are sensitive to the atomic number so organic matter, which has low atomic number, appears darker. These SEM-BSE images are a clear indication of anisotropy where the organic-rich laminations only appear in the perpendicular sample. The main reason for the anisotropy is the organic-rich laminations which occur on the scale of about 200 μm. The organic-rich layers act to restrict fluid transport in the vertical direction relative to the horizontal direction. Thus, fluid transport anisotropy may be measured using restricted diffusion NMR.

In embodiments, the methods described herein may utilize the method of the modified Carman-Kozeny model (Chen et al. 2019a, Chen et al. 2019b, Vinegar et al. 2020a, Vinegar et al. 2020b, Vinegar et al. 2020c, Vinegar et al. 2021, Wang et al. 2020, Wang et al. 2021a, Liu et al. 2023) and further extend the application to measure the permeability anisotropy. From the NMR restricted diffusion measurements of organic-rich chalks from the Golan basin, it is possible to observe strong anisotropy in the tortuosity but not in the pore size estimation. The difference in anisotropy accounts most for the permeability anisotropy in the organic-rich chalks.

The diffusion length at which the vertical core reaches its tortuosity limit is significantly shorter than in the horizontal direction. The value of diffusion length is interpreted to be ~100 μm, where the vertical diffusion reaches the asymptotic limit, as the half spacing between laminations due to the depositional cycle. Without wishing to be limited to a particular theory, the authors of the present disclosure have proposed that relatively consistent 200-μm spacing is caused by a deposition cycle driven by the ENSO-like climate patterns in the late Cretaceous.

Exemplary Application

An exemplary application of the method to measuring a depositional cycle from the Tethys Sea in the late Cretaceous period in the Ghareb formation, which appears to be equivalent to the present day El Niño-Southern Oscillation cycle, is described.

The NMR anisotropic restricted diffusion measurements were made on adjacent 1" core plugs drilled parallel and perpendicular to the bedding plane. The cores at connate water saturation were then saturated with methane at 1,200 psi and 30° C., then saturated with decane, for NMR restricted diffusion measurements. Different values of diffusion time were used to probe both the short $L_D$ (diffusion length) regime with decane to determine surface-to-volume ratio S/V, and long $L_D$ regime with methane to determine $\tau$, where $\tau$ is the diffusive tortuosity. Pore size and tortuosity were estimated based on the NMR-restricted diffusion versus diffusion length data, and then used in a modified Carman-Kozeny model to predict the permeability anisotropy.

The S/V is the same for horizontal and vertical directions, indicating the pore size is the same in the two samples. The permeabilities, computed from a modified Carman-Kozeny model, show tortuosity is the main factor in the anisotropy of the measured core permeabilities. The diffusive tortuosity is much greater in the vertical direction than the horizontal direction due to the additional diffusional restriction from the depositional laminations.

The $L_D$ at which the vertical core reaches its tortuosity limit was found to be is significantly shorter than in the horizontal direction. The value of $L_D$ is interpreted to be ~100 μm, where the vertical diffusion reaches the asymptotic limit, as the half spacing between laminations due to the depositional cycle.

SEM images of the organic-rich chalk in this zone show several laminations with the half-spacing between laminations about 100 μm, which is consistent with NMR restricted diffusion results.

The Ghareb formation has been carefully dated in this region and the rate of deposition is known. Thus, the lamination spacing shown in the NMR restricted diffusion enable estimation of the duration of the depositional cycle in this late Cretaceous period (about 69 Mya). It is worth noting that the timing of this paleo-depositional cycle was very close to the present day El Niño-Southern Oscillation cycle, which validates the disclosed method as a new way to study paleo-climactic depositional cycles on cores.

Permeability Estimation and Anisotropy

NMR provides a non-invasive technique for predicting permeability from empirical models based on NMR $T_2$ relaxation, such as the Timur-Coates model (Timur 1969, Coates 1991), and the SDR (Schlumberger-Doll Research) model (a.k.a. the Kenyon model) (Kenyon et al. 1988). More recent applications include (Elsayed et al. 2021, Zhang et al. 2021, Storebø et al. 2022, Chen et al. 2022, Cheng et al. 2022). Both the Timur-Coates and the SDR models were originally developed for sandstones, though both have also been used for carbonates with variable success. Furthermore, both models require re-calibrating if there is vuggy porosity, diffusive coupling, internal gradients, and/or movable heavy oil.

A more robust permeability model without any empirical parameters is the Carman-Kozeny model (Carman 1997, Dullien 1979), which assumes the pore space can be approximated by a parallel bundle of capillary tubes. The modified Carman-Kozeny model is successful when applied to NMR diffusion-$T_2$ maps in organic-rich chalks from the Golan Heights (Chen et al. 2019a, Chen et al. 2019b, Vinegar et al. 2020a, Vinegar et al. 2020b, Vinegar et al. 2020c, Vinegar et al. 2021, Wang et al. 2020, Wang et al. 2021a, Liu et al. 2023), and by monitoring the $T_2$ signal intensity during $H_2O$-$D_2O$ exchange (i.e., deuteration) in organic-rich shales from the Point-Pleasant formation (Wang et al. 2021b). These reports show the modified Carman-Kozeny can successfully predict permeability from NMR core analysis for over ≈9 orders of magnitude in permeability ($10^{-6} \leftrightarrow 10^{3}$ mD), without any empirical parameters.

Determination of pore connectivity by monitoring the NMR signal intensity during core deuteration has also been reported in other organic-rich shale formations (Dang et al. 2021, Li et al. 2022).

A modified Carman-Kozeny model was used to estimate the permeability of the rock samples (Wang et al. 2020). The modified Carman-Kozeny model is as follows: below:

$$k = \frac{\phi}{32\tau_{hy}} d_{throat}^2 \sim \frac{\phi}{32\,\tau} \frac{d^2}{BTR^2}$$

$$\tau = \frac{D_0}{D_\infty}$$

where $d_{throat}$ is the pore-throat diameter, d is the pore-body diameter, BTR is the body-to-throat ratio, ϕ is porosity, t is the diffusive tortuosity which can be measured by NMR restricted diffusion measurements. Here the diffusive tortuosity can be assumed to be equal to the hydraulic tortuosity.

Using the tortuosity (τ), pore-body size (d), and porosity (ϕ) and estimating pore-body to the pore-throat ratio for a known lithology, permeability can be estimated. This permeability method is then used to estimate permeability anisotropy $k_\perp/k_\parallel$.

Restricted Diffusion and NMR Measurements

For the permeability estimation using the modified Carman-Kozeny model, tortuosity is essential. NMR is used to measure the restricted molecular diffusivity of fluid. In the bulk fluid, the molecule diffuses with its bulk diffusivity ($D_0$). However, in porous media, the diffusivity is restricted by the pore walls and is smaller than in the bulk fluid. Therefore, the normalized restricted diffusivity ($D/D_0$) reflects the geometry of the connected pore space.

According to Latour et al. (1993), the restricted diffusion is a function of bulk diffusivity ($D_0$), diffusion time ($\tau_\Delta$), surface-to-volume ratio (S/V) of the pore, heterogeneity length-scale ($L_M$), and diffusive tortuosity (τ). The Padé equation describes the relation between these variables as such:

$$\frac{D(L_D)}{D_0} = 1 - \left(1 - \frac{1}{\tau}\right) \frac{\frac{4S}{9\sqrt{\pi}\,V} L_D + \left(1 - \frac{1}{\tau}\right)\frac{L_D^2}{L_M^2}}{\frac{4S}{9\sqrt{\pi}\,V} L_D + \left(1 - \frac{1}{\tau}\right)\frac{L_D^2}{L_M^2} + \left(1 - \frac{1}{\tau}\right)}$$

$$L_D = \sqrt{D_0 t_\Delta},\ \frac{S}{V} = \frac{2}{r} = \frac{4}{d}$$

where $L_D$ is the diffusion length, which indicates of the average length of the movement of molecules.

In planning the $^1$H NMR restricted diffusivity measurements, an optimized series of diffusion-encoding times are selected (Wang et al.2021a). High pressure methane (large self-diffusivity) and liquid decane (small self-diffusivity) are selected as the protonated probing fluids for $^1$H NMR measurements, so better-quality data can be acquired over a large range of diffusion lengths. Other protonated fluids such as high pressure ethane can also be utilized. By applying the Padé fit to restricted diffusivity, the tortuosity (τ) and pore-body size (d) of the hydrocarbon-filled pore-space can be estimated.

EXPERIMENTAL DETAILS

A GeoSpec2 rock-core analyzer by Oxford Instruments was used to make the NMR measurements. A frequency of 2.3 MHz for $^1$H was used, which is like the Larmor frequency of NMR downhole logging tools. An Oxford Instruments NMR overburden cell was used for high-pressure saturation measurements.

Permeability anisotropy was analyzed on two rock types, Berea sandstone (Kocurek Industries, Caldwell, TX) and organic-rich chalk from the Ghareb formation in the NESS 2 well in Golan basin of northern Israel. Information on the organic-rich chalk can be found in (Wang et al. 2021a). Adjacent 1" core plugs drilled parallel and perpendicular to the bedding plane are used for this anisotropy study. For NMR measurements, the cores at connate water ($H_2O$ or $D_2O$) saturation were saturated first with methane at 1200 psi and 30° C., then degassed, and re-saturated with decane. The core samples were saturated with hydrocarbon with connate water present in order to avoid diffusive coupling between the water-wet micritic calcite pores and mix-wet hydrocarbon-bearing pores.

The NMR measurements used unipolar stimulated-echo pulsed-field gradient sequences. Different values of diffusion time were used to probe both the short $L_D$ (diffusion length) regime with decane to determine surface-to-volume ratio S/V, and long $L_D$ regime with methane to determine t, where t is the diffusive tortuosity. Pore size and tortuosity were estimated based on the NMR-restricted diffusion versus diffusion length data and then used in a modified Carman-Kozeny model to predict the permeability anisotropy.

1D $T_2$ measurements were acquired using CPMG (Carr-Purcell-Meiboom-Gill) pulse sequences with echo spacing of $t_E$=0.2 ms. NMR 2D D-$T_2$ data were acquired using the pulsed-field gradient sequence as a function of diffusion evolution time ty, followed by $T_2$ encoding. The inversion algorithm by (Venkataramanan et al. 2002) was used throughout.

Results and Discussion

NMR Restricted Diffusion

Figure 2A:
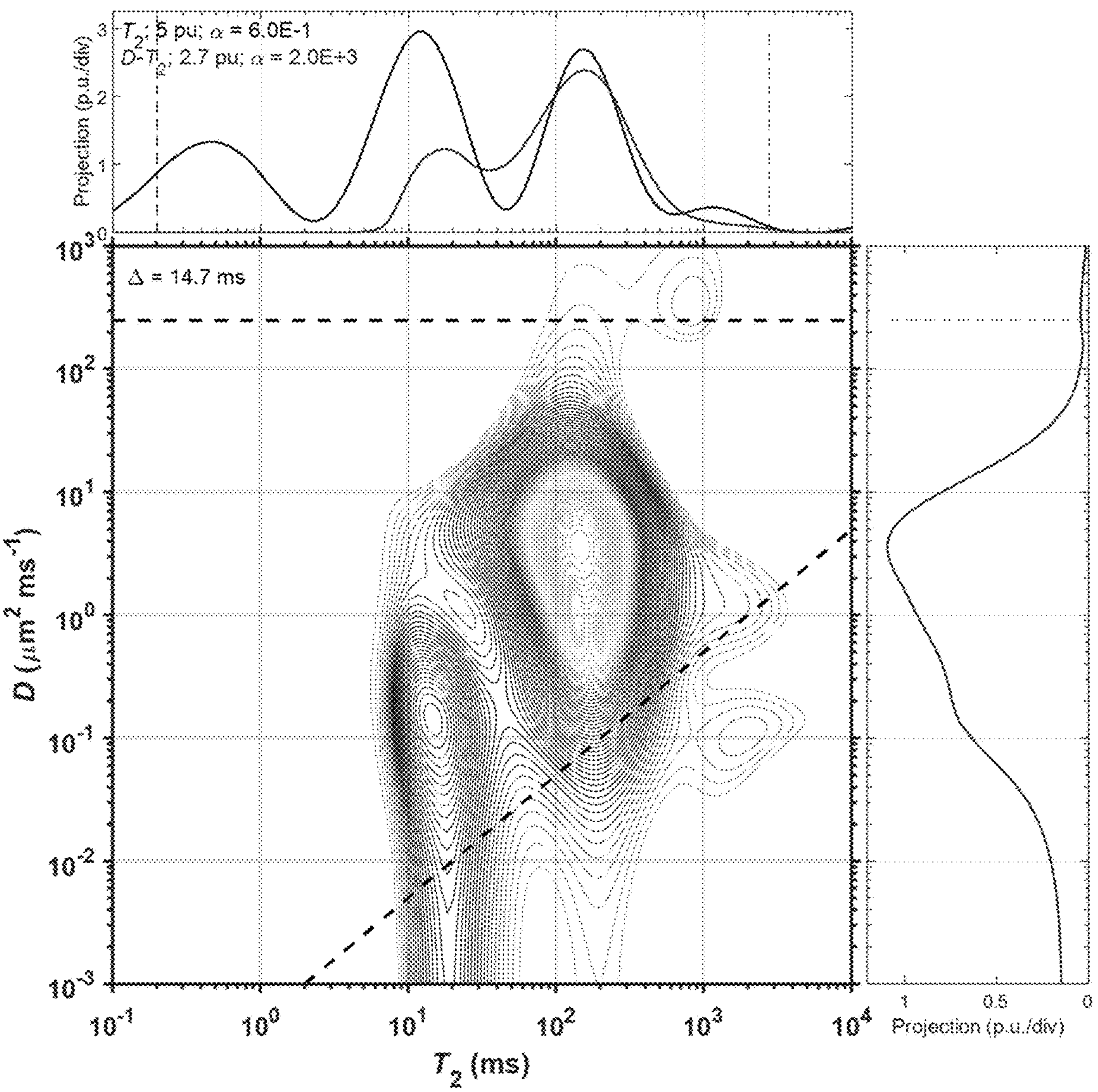
FIGS. 2A and 2B show exemplary D-$T_2$ correlation maps, for horizontal and vertical core samples, respectively, according to embodiments of the present invention.
Figure 2B:
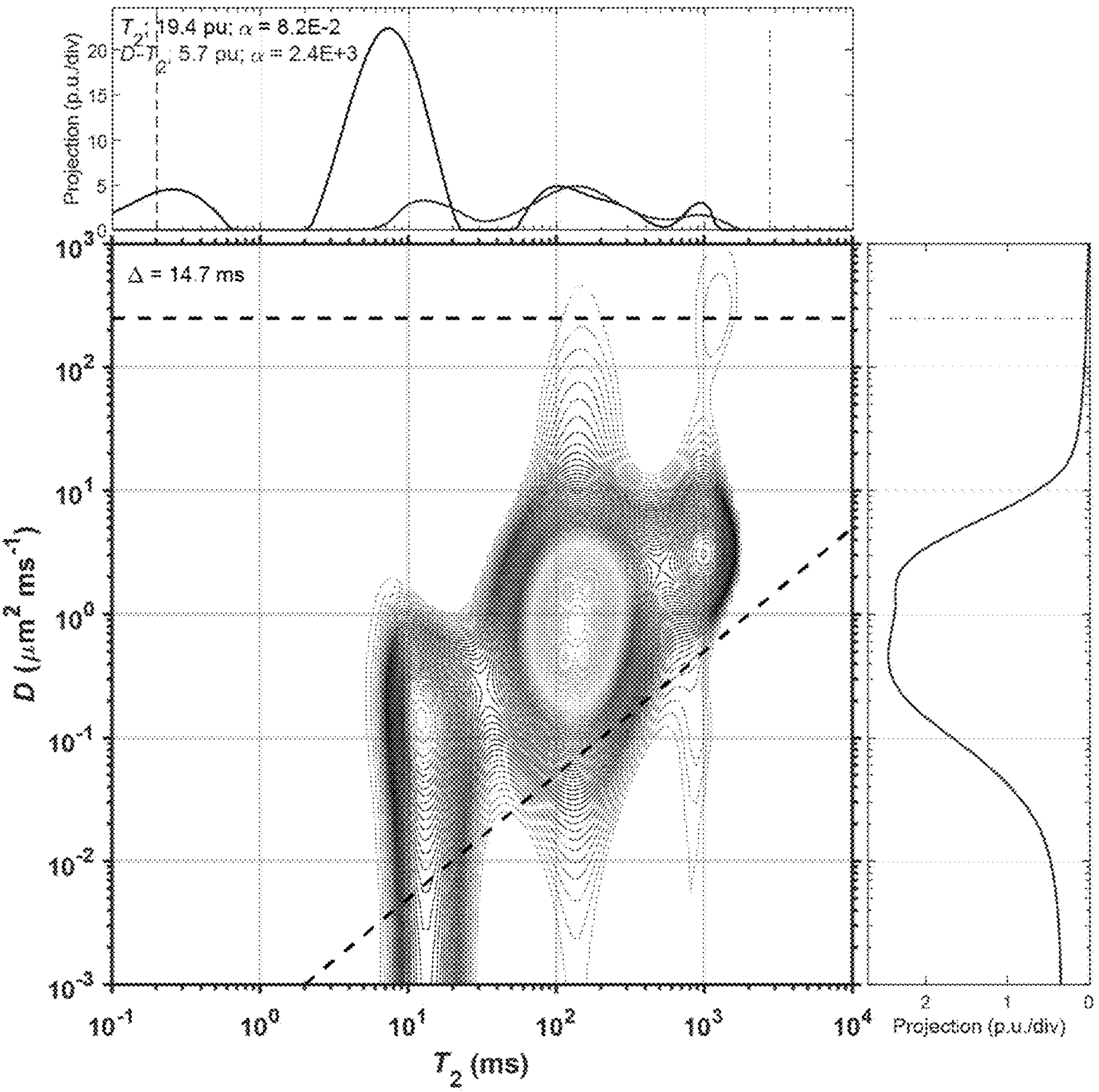

FIGS. 2A and 2B show the representative D-$T_2$ maps for NESS 920 m organic-rich chalks using high-pressure methane saturation. FIG. 2A is the horizontal core sample (Chen et al. 2019b), and FIG. 2B is the vertical core sample, both at $\tau_\Delta$=14.7 ms (i.e., $L_D$≈61 □m). The y-axis shows the restricted diffusivity, and the x-axis shows the $T_2$. The oil correlation time (Lo et al. 2002) is shown as the diagonal dash line. The unit "pu1$_D$" is the porosity from the D-$T_2$ measurement assuming HI=1. (Note the 920 horizontal was $D_2O$ deuterated before methane saturation in Chen et al. 2019b)

Different diffusion lengths $L_D$ are acquired by changing the diffusion-evolution time $\tau_\Delta$ in the pulse parameter setting. To retrieve the restricted diffusion information of the hydrocarbons, the 2D peak value (i.e., the mode) between (50 ms to 1000 ms) is selected from the D-$T_2$ maps. This region is the hydrocarbon filled region. The restricted diffusivity of methane is smaller in the vertical direction than the horizontal direction because of the larger diffusive tortuosity in the vertical direction.

Padé Fit on $D/D_0$ versus $L_D$

Figure 3:
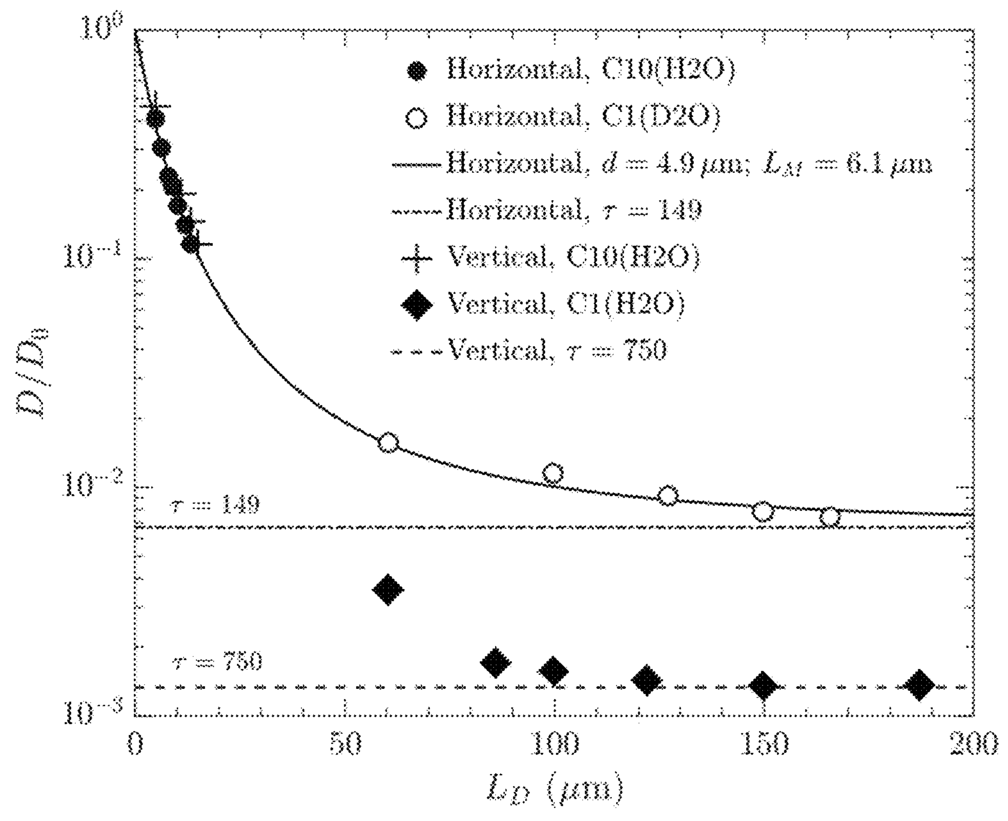
FIG. 3 shows a graph of diffusion length ($L_D$) versus normalized restricted diffusivity (D/Do) for methane and decane-saturated organic-rich chalk samples in the horizontal and vertical directions, according to embodiments of the present invention.

The Padé fit is an interpolation function used to estimate pore-body size and tortuosity from NMR measured restricted diffusivity. FIG. 3 shows, diffusion length ($L_D$) versus normalized restricted diffusivity ($D/D_0$) for the methane and decane-saturated NESS 2 920 m organic-rich chalk samples in the horizontal and vertical directions. The parameters of the Pade fit for the horizontal sample were obtained using the non-linear curve-fitting function (lsqcurvefit) in MATLAB. The loss function is the minimum square error on a log scale.

In FIG. 3, the two curves overlay in the short $L_D$ regime with decane because the samples have the same surface-to-volume ratio, S/V. However, the asymptotic limit with methane, where $D/D_0$ approaches $1/\tau$, is very different for the horizontal and vertical directions. The estimated diffusive tortuosity for the vertical core is ~5 times larger than the horizontal core due to the organic-matter laminations. The value of $L_D$ is interpreted to be ~100 μm, where the vertical diffusion reaches the asymptotic limit, as the half spacing between laminations due to the paleo-depositional cycle.

Figure 4:
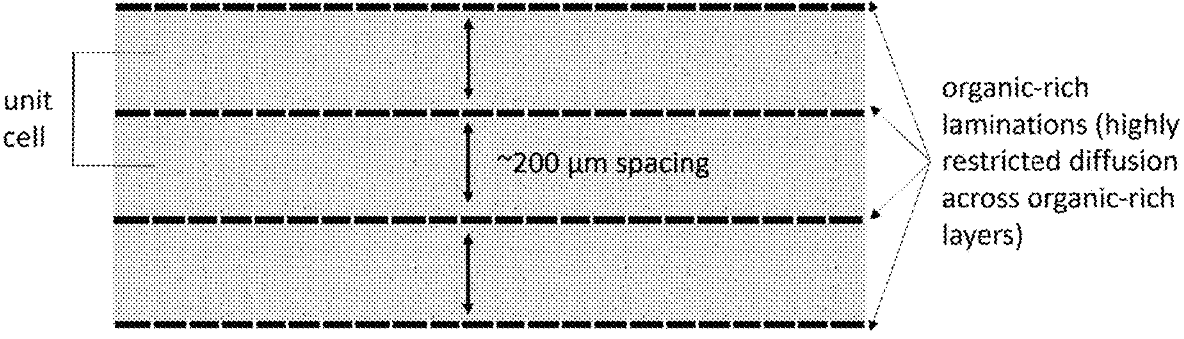
FIG. 4 shows a schematic of repeating organic-rich layers, according to embodiments of the present invention.

FIG. 4 illustrates the repeating unit cell, which is 100 μm on either side of the diffusion-restricted laminations. It is noted the Padé fit works for the restricted diffusivity of the horizontal core but not as well for the vertical cores because the vertical core has much larger heterogeneity (see appendix). As can be seen in the schematic of FIG. 4, the organic-rich layers repeat every 200 μm. The organic-rich layers are restricted diffusion layers. The repeating unit cell is 100 μm on either side of the diffusion-restricted laminations. The laminations are shown as partially open because they restrict but do not completely block transport. If the laminations completely blocked transport, the $D/D_0$ vs $L_D$ curves in FIG. 3 would not asymptote but instead continue to decrease.

Permeability Estimation

Figure 5A:
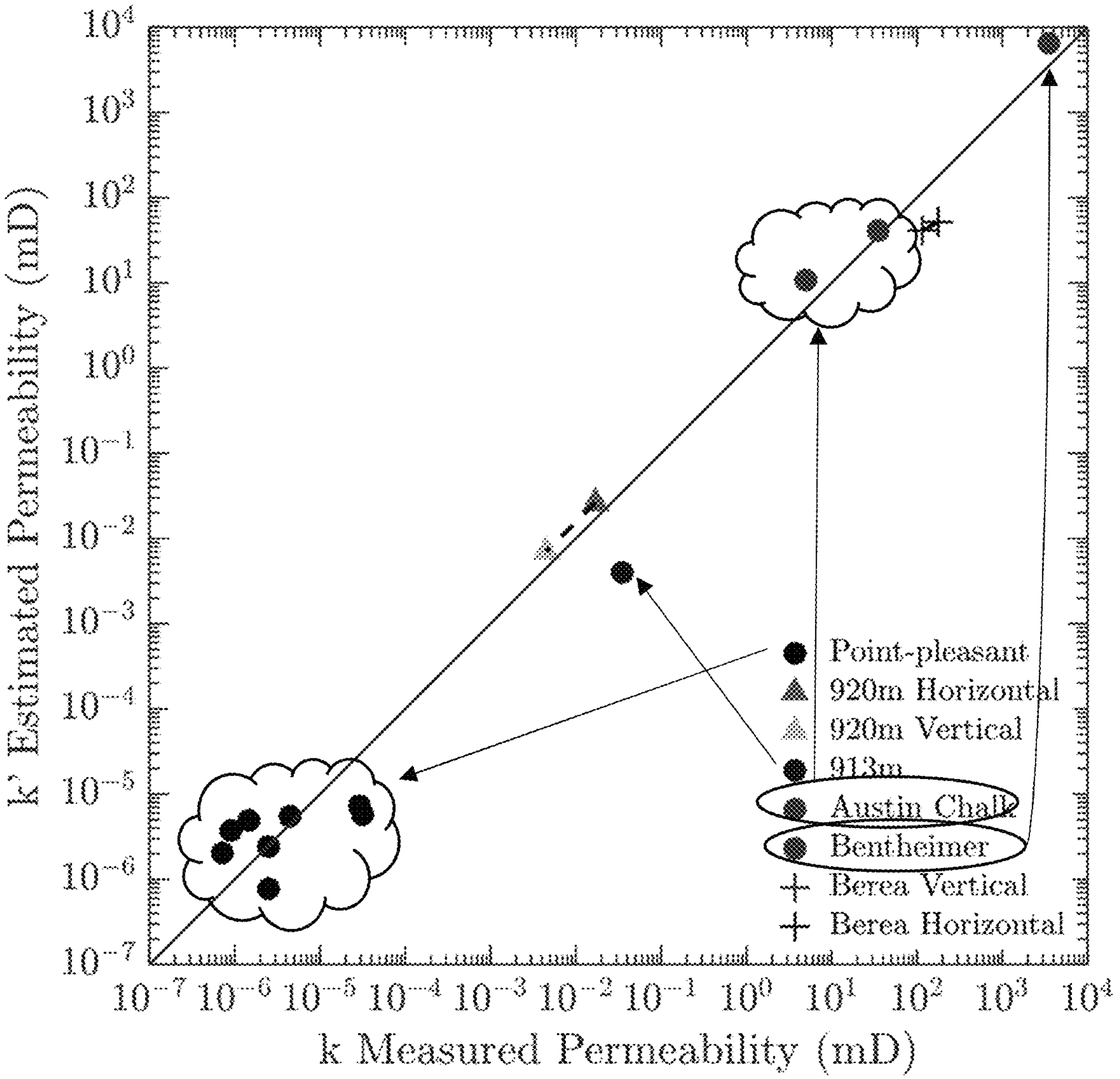
FIG. 5A shows a graph of estimated vs measured permeability of various rocks, according to embodiments of the present invention.
Figure 5B:
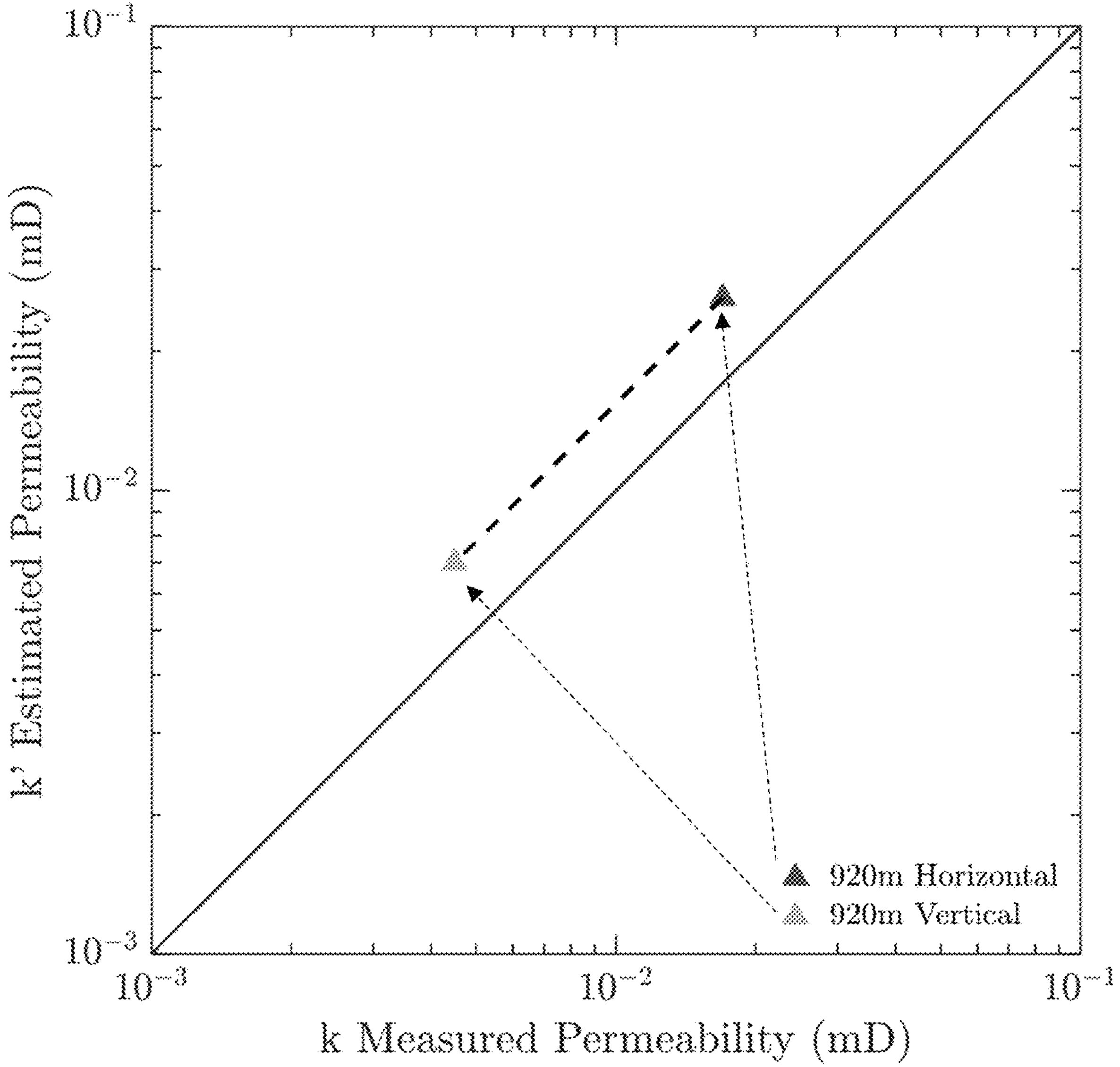
FIG. 5B shows graph providing a detail of measured and estimated permeabilities for vertical and horizontal samples, according to embodiments of the present invention.

We now refer to FIGS. 5A and 5B, which show permeability estimation for various rock types.

For NESS 2 913 and 920m organic rich chalks, a BTR of 5 is assumed in the modified Carman-Kozeny model. The BTR of 5 originates from the Austin chalk sample where MICP pore-throat size ($d_{throat}$) using the Swanson method (Swanson, 1981) and pore-body size (d) yield BTR=d/$d_{throat}$=5. For the Bentheimer and Berea sandstones, a value of BTR=3 is used. For the Point-Pleasant cores, a variation of the Carman-Kozeny permeability estimation is used which involves monitoring the signal intensity from $T_2$ during core deuteration (Wang et al. 2021b).

FIG. 5A shows this modified Carman-Kozeny model is a good permeability estimation method over a wide range of permeabilities (≈9 orders of magnitude). Among its many advantages, this NMR method does not need empirical parameters for calibration of the permeabilities, as required by the Schlumberger and Timur-Coates methods. As shown in FIG. 5A, this NMR method works in multiple lithologies, such as sandstones and carbonates, as well as in complex pore systems such as dual-porosity mixed-wettability chalks. The NMR method is not affected by surface wettability because it relies on molecular diffusion rather than surface relaxation. The estimated permeability anisotropy of the organic-rich chalk and the Berea sandstone is very close to the measured one. It is observed the organic-rich chalk has a much larger permeability anisotropy compared to the Berea sandstone, which only has a 25% permeability anisotropy. The difference in anisotropies comes from the distinct organic-rich laminations in the chalk compared to the very subtle bedding in the Berea sandstone sample. FIG. 5A shows estimated vs measured permeability of various rocks. The measured permeabilities are Klinkenberg-corrected. Note the excellent agreement over 9 orders of magnitude in permeability. FIG. 5B is a close-up view of the 920 m horizontal and vertical cores. Note the line connecting the two cores is parallel to the equal-value line (red). FIG. 5B shows a closer look at the measured and estimated permeabilities for the 920 m depth vertical and horizontal samples from NESS 2. Note the line connecting the vertical and horizontal samples is almost parallel to the equal value line. Because the porosity, pore-throat size, and body-to-throat ratio are assumed to be isotropic in our modified Carmen-Kozeny model, the tortuosity is the only factor contributing to the permeability anisotropy. The line connecting the vertical and horizontal samples is close to and parallel to the equal-value line which confirms this NMR restricted diffusion method provides accurate values of permeability anisotropy.

It is noted this NMR permeability estimation method works in multiple lithologies such as sandstones and carbonates, in complex systems such as dual-porosity mixed-wettability chalks, and because it relies on diffusion rather than relaxation it is not affected by wettability.

Paleoclimate Application

The following paragraphs relate the NMR anisotropic restricted diffusion measurements to the paleoclimatic history of the organic-rich chalk samples from the Ghareb-Mishash formations. The NMR restricted diffusion measurements are connected to the spacing of the organic matter laminations to study the occurrence of depositional cycles in the Late Cretaceous period.

The core samples used in the NMR measurements were from the Golan basin in northern Israel. The samples were deposited during the Late Cretaceous period.

Figure 6:
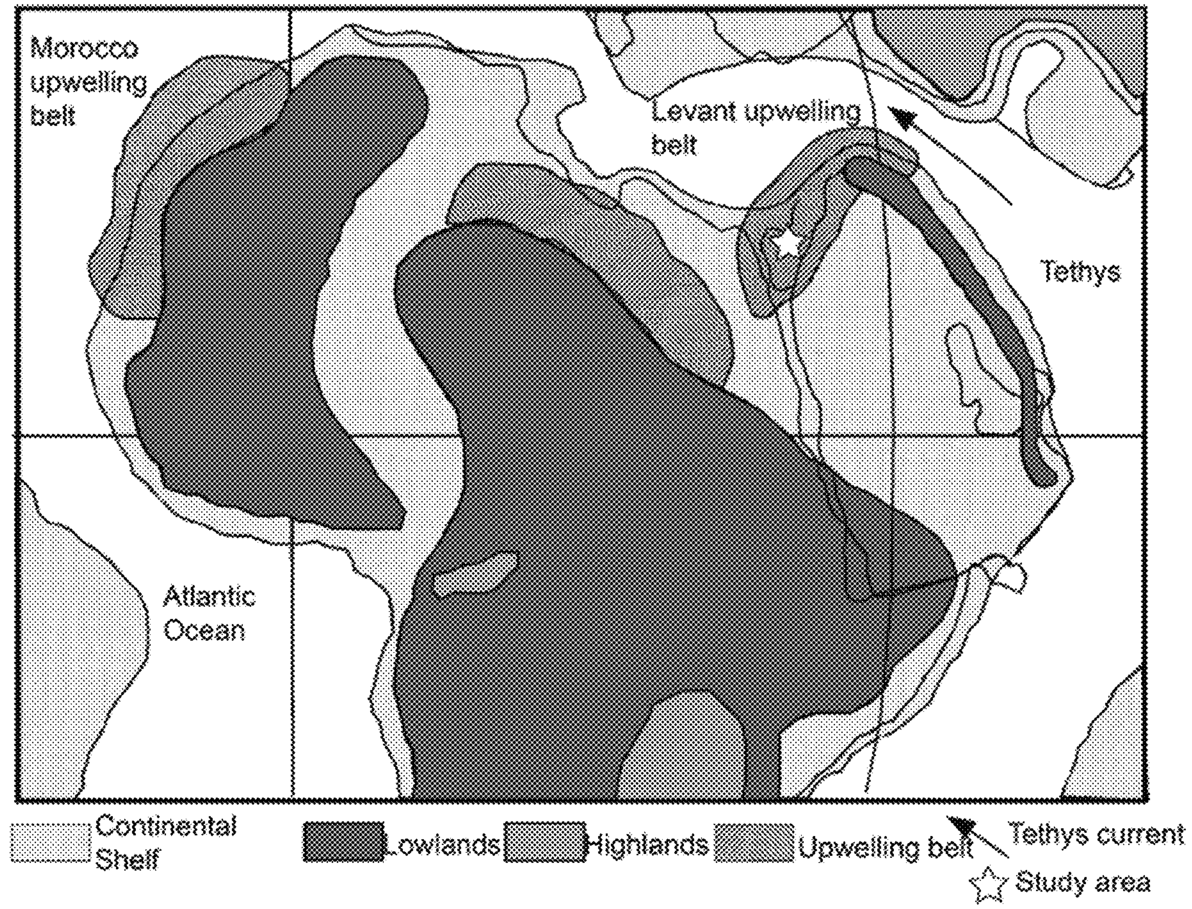
FIG. 6 shows a paleographic reconstruction showing the upwelling belts, according to embodiments of the present invention.

During the Late Cretaceous period, the Arabian Plate was subsiding, causing marine transgression (sea level rise with respect to the land). A widespread upwelling environment brought cold, nutrient-rich water closer to the surface, creating conditions for oceanic life to bloom in the region between 86-69 Mya (Almogi-Labin et al. 1990, 1993; Meilijson et al. 2014). Planktonic and benthonic foraminiferids and coccolithophorids were deposited in sub-oxic to anoxic conditions, thus preserving the organic matter and forming organic-rich chalks, cherts, and phosphates. Many of the synclinal basins which developed from the Syrian Arc folding were filled in during the upwelling event with very thick deposits of organic matter. FIG. 6 shows a paleographic reconstruction showing the upwelling belts in the Levant during the Late Cretaceous (69-86 Mya), reproduced from (Meilijson et al. 2018).

Figure 7:
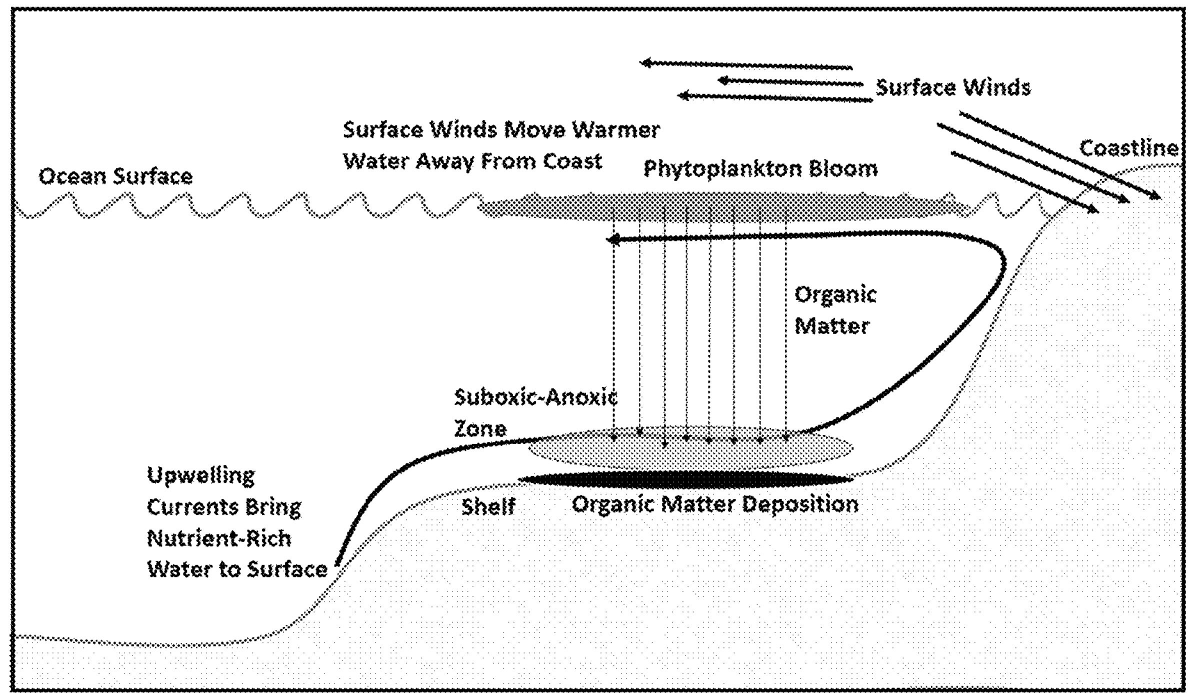
FIG. 7 shows a schematic of organic matter deposition due to upwelling according to embodiments of the present invention.

FIG. 7 shows a schematic of organic matter deposition due to upwelling. Upwelling currents bring nutrient-rich water to the surface, stimulating phytoplankton and zooplankton blooms. As the plankton die and pass through the water column, oxygen is used up during decomposition and a suboxic-anoxic zone is formed, which preserves the organic matter deposit (Meilijson et al. 2018, Abed 2013).

Meilijson et al. 2014 used continuous core data from the Ghareb, including planktonic and benthic foraminiferal biostratigraphy, lithostratigraphy, and gamma-ray well log markers, to estimate the period of high-productivity deposition in the Ghareb formation was 19 million years. The mean sedimentation rate of the organic-rich Ghareb formation during this time was about 58 μm/year (Table 3 in Meilijson et al. 2014).

Figure 8:
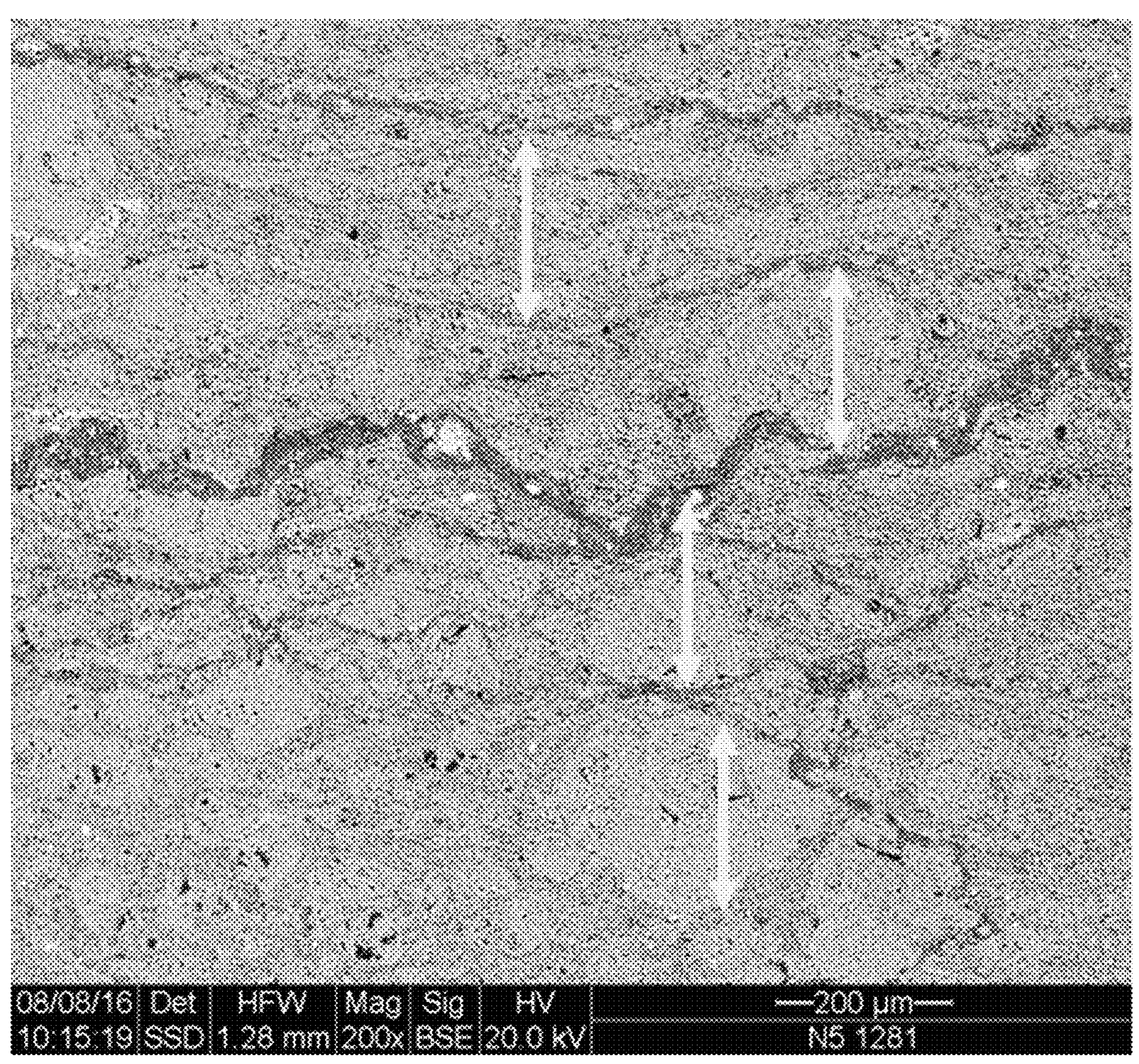
FIG. 8 shows a SEM-BEI sample image showing an example of organic-rich laminations, according to embodiments of the present invention.

Without wishing to be limited to a particular theory, the authors of the present disclosure hypothesize that cyclical climactic variations in the paleo-environment, like the present day El Niño-Southern Oscillation cycle, caused cyclical, rapid growth of plankton in favorable upwelling conditions, leading to the deposition of very concentrated laminations of organic matter (Jochum et al. 2010, Shute et al. 2022). SEM images of the organic-rich chalk in this Ghareb zone show several thin, very organic-rich laminations with the half-spacing between laminations about 100 μm, which is consistent with our NMR restricted diffusion results. The concentrated organic matter in the laminations act as diffusional barriers which restrict (but do not stop) the NMR diffusion of methane. A SEM-BEI image of a sample from the NESS 5 well at 1281 m depth, reproduced in FIG. 8, provides an example of these laminations. Roughly 200 μm spacing may be observed between the major laminations (white arrows).

Figure 9:
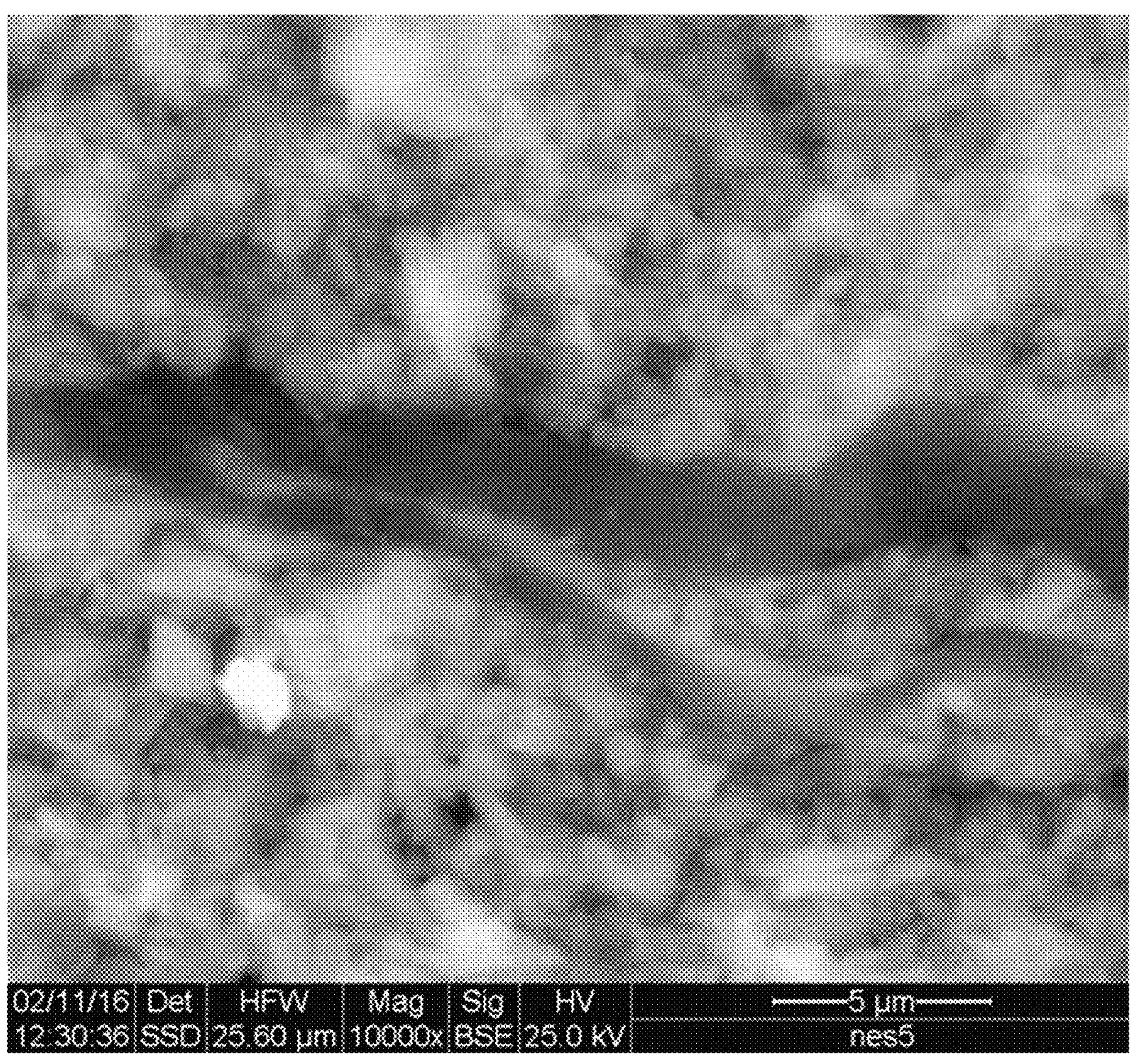
FIG. 9 shows a close-up SEM-BEI image of an organic-rich lamination, according to embodiments of the present invention.

FIG. 9 shows a close-up SEM-BEI image of an organic-rich lamination from this depth. The organic-rich lamination is about 3 μm thick.

Comparison with Present-Day El Niño Cycles

The Ghareb formation has been carefully dated in this region and the rate of deposition is known (Meilijson et al. 2014). Thus, the laminations shown in the $^1$H NMR anisotropic restricted diffusion enable us to estimate the duration of the depositional cycle in this late Cretaceous period (~69 Mya). The timing of this paleo-depositional cycle is thus found to be about (200 μm/(58 μm/year)) ~3.4 years per cycle. Examining FIG. 3 in detail, the $L_D$ at the asymptotic tortuosity limit is more exactly 125 μm, so the timing of this paleo-depositional cycle is (250 μm/(58 μm/year)=4.31 years per cycle. This is very close to the present-day El Niño-Southern Oscillation (ENSO) cycle from 1850-2021 with 35 cycles over 171 years, averaging about 4.89 years per cycle with variations from 2- to7 years. (Webb and Magi, 2022).

The El Niño-Southern Oscillation (ENSO) cycle, which encompasses several processes affecting the sea surface temperature of the (Pacific) ocean and global climate, varies in duration and intensity. Proxies which respond to temperature are used to analyze the presence and relative intensity of the ENSO phenomenon. For example, ENSO has been tracked using fossil coral reconstructions spanning 7000 years to the mid-Holocene (Cobb et al. 2013) and 130,000 years ago (Hughen et al. 1999). Other proxies include productivity indicated on geological core samples, such as light and dark layers, fossils, and evaporite varve thickness.

This is the first use of NMR anisotropic restricted diffusion measurements to track a paleo-depositional cycle.

SUMMARY OF METHODS

In the present disclosure, a new method is demonstrated for estimating permeability anisotropy using NMR restricted diffusion measurements on core cut parallel and perpendicular to bedding. For the organic-rich chalk studied here, the permeabilities, computed from a modified Carman-Kozeny model, the isotropic parameters such as S/V, pore-throat size, and body-to-throat ratio, are the same in both directions. This shows the diffusive tortuosity is the main factor in the anisotropy of the parallel and perpendicular core permeabilities (permeability anisotropy ≈5). The diffusive tortuosity in these organic-rich chalks is much greater perpendicular to bedding due to the additional diffusional restriction from the depositional organic-rich laminations.

Although this disclosure relates to two cores cut parallel and perpendicular to bedding, similar results could have been obtained with a single core using an NMR spectrometer with 2D or 3D pulsed-field gradients.

Using high-pressure methane as the fluid saturant, the diffusion length, $L_D$, at which the vertical core reaches its tortuosity limit is found to be significantly shorter than in the horizontal direction. The value of $L_D$ is interpreted to be ~100 μm, where the vertical diffusion reaches the asymptotic limit, as the average half spacing between laminations due to the depositional cycle. SEM-BSE images of the organic-rich chalk in this zone show organic-rich laminations with the spacing between laminations about 200 μm, which is consistent with the NMR restricted diffusion results.

Because the rate of deposition is known for the Ghareb-Mishash formations in the Golan Heights, the laminations shown in the NMR restricted diffusion measurements enable us to estimate the duration of the depositional cycle in this late Cretaceous period (~69 Mya). The timing of this paleo-depositional cycle, ~4.31 years per cycle, can be seen as being very close to the present-day El Niño-Southern Oscillation cycle of 4.89 years per cycle (~2-7 years). This promising new method for studying paleo-climactic depositional cycles on cores can be applied in other formations.

Downhole Logging Applications

A new method is shown which uses NMR diffusion-$T_2$ logs and the modified Carman-Kozeny relation to determine a permeability log, both parallel and perpendicular to bedding, to determine the permeability anisotropy. The method requires a "pad" or "mandrel" (rather than centric) NMR tool with diffusion-$T_2$ capabilities. Diffusion-$T_2$ logging typically requires a wireline tool rather than a logging while drilling (LWD) tool. Furthermore, LWD tools are in constant rotation; for centric LWD tools this is not an issue, however for mandrel LWD tools this would require complex anisotropy corrections (even for $T_2$ logging).

Figure 10:
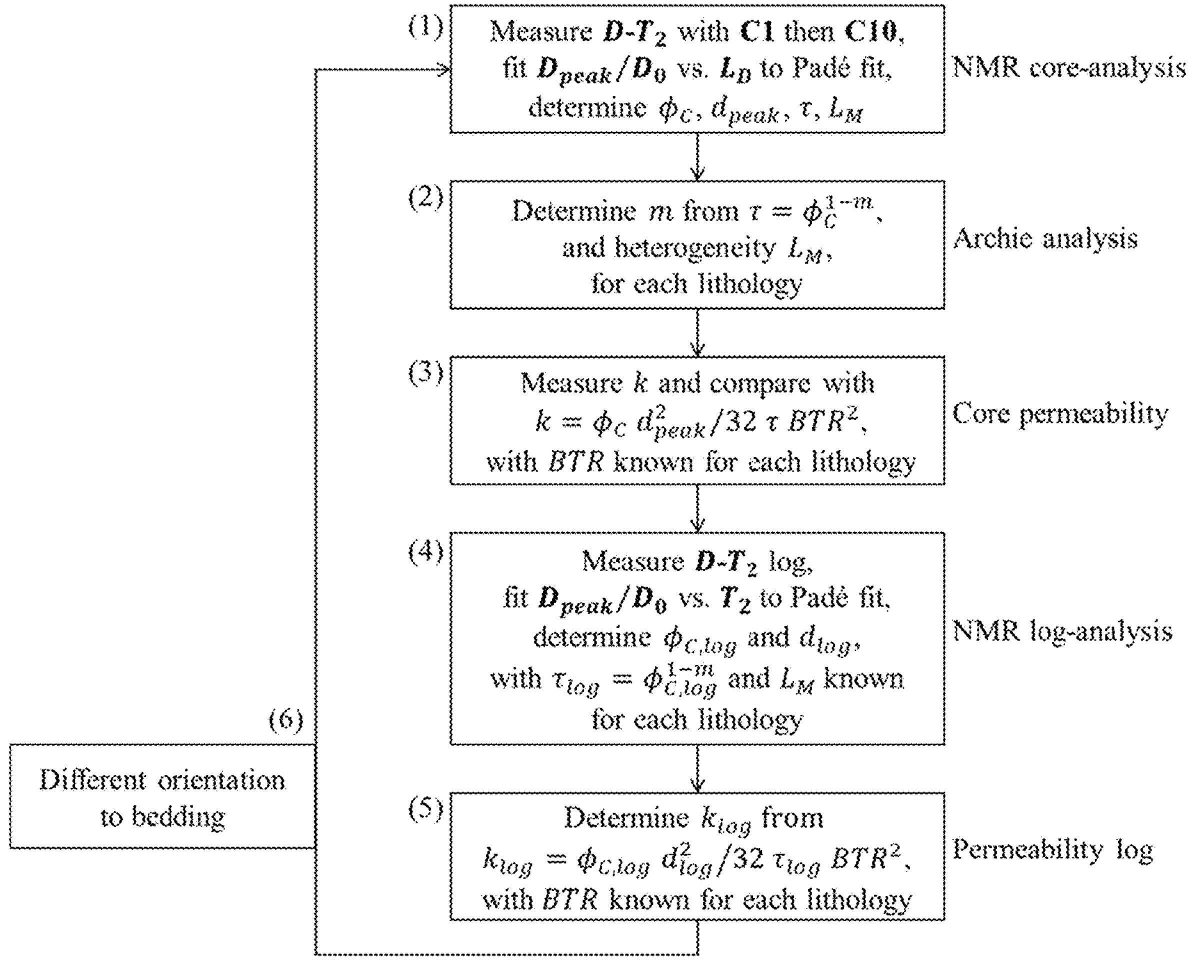
FIG. 10 shows a flow chart of a method for determining permeability anisotropy log from D-$T_2$ logs and core-analysis, according to embodiments of the present invention.

FIG. 10 outlines a core-log integrated workflow to obtain a downhole permeability anisotropy log from diffusion-$T_2$ (a.k.a. D-$T_2$) on cores and D-$T_2$ logs, including the following steps:

1) D-$T_2$ maps are measured in the laboratory on methane (C1) saturated and decane (C10) saturated cores at connate water-saturation (deuterated, if required) from a selection of depths which cover all the different lithologies (i.e., rock types) in the reservoir. The porosity of the hydrocarbon region ($\phi_C$) is determined. A Padé fit of $D_{peak}/D_0$ versus $L_D$ in the hydrocarbon region is performed to estimate pore-body size ($d_{peak}$), heterogeneity length scale ($L_M$) and hydrocarbon diffusive tortuosity ($\tau$) for each lithology.

2) A power law exponent m is determined from the relation $$\tau = \phi_C^{1-m}$$

(where $\tau$ and $\phi_C$ are known). Note this yields m for the hydrocarbon phase at connate water-saturation. The values of m and $L_M$ are now known for each lithology. Note this also presents a new method to determine m.

3) The permeability (k) of each core is measured (Klinkenberg-corrected), and is compared to the Carman-Kozeny model $$k = \phi_C \ d_{peak}^2/32 \ \tau \ BTR^2$$

where $\phi_C$, $d_{peak}$, $\tau$ are known, and BTR is determined from petrographic interpretations for each lithology.

4) D-$T_2$ logs are measured downhole across the reservoir interval where cores were taken, at the same orientation to bedding as the cores. The porosity of the hydrocarbon region ($\phi_{C,log}$) is determined. A Padé fit of $D_{peak}/D_0$ versus $T_2$ in the hydrocarbon region is performed to estimate pore-body size ($d_{log}$), where $L_M$ and $\tau_{log}$ (using the relation $$\tau_{log} = \phi_{C,log}^{1-m})$$

are fixed parameters. The bulk hydrocarbon properties $D_0$ and $T_{2B}$ are determined from known correlations against T/η and GOR (gas-oil ratio), which makes $d_{log}$ the only free parameter in the Padé fit of $D_{peak}/D_0$ versus $T_2$.

5) The permeability log ($k_{log}$) is determined from the modified Carman-Kozeny relation $$k_{log} = \phi_{C,log} \ d_{log}^2/32 \ \tau_{log} \ BTR^2$$

(where $\phi_{C,log}$, $d_{log}$, $\tau_{log}$, and BTR at each lithology are known), for a given orientation to bedding.

6) Go back through steps (1)-(5), but rotate the D-$T_2$ logging direction, i.e., from $k_{\parallel}$ to $k_{\perp}$, and use the core calibrated m, $L_M$, BTR values along the same direction as the log, thereby obtaining the permeability anisotropy $k_{\perp}/k_{\parallel}$. The core calibration step in the laboratory can be done with either another plug cored along a different orientation to bedding (i.e., with 1D NMR magnetic-field gradients), or by changing the direction of the diffusion measurement (i.e., with 2D or 3D NMR magnetic-field gradients) on the same plug.

Note the tortuosity anisotropy is a function of the anisotropy in the power law exponent m, while the porosity of the hydrocarbon-filled region (c) is isotropic.

Figure 11:
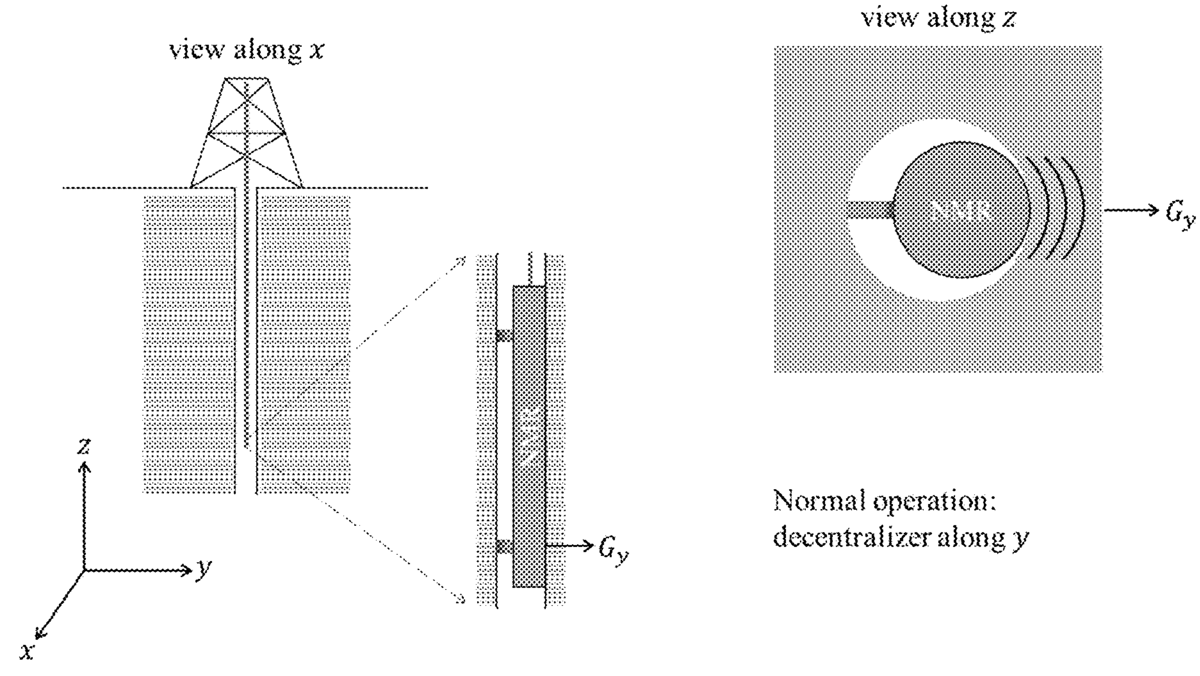
FIG. 11 shows a schematic for measuring $k_{\|}$ logs in a vertical well, according to embodiments of the present invention.

FIG. 11 shows how an NMR tool measures D-$T_2$ logs in a vertical well to obtain the permeability parallel to bedding ($k_{\parallel}$). The tool's decentralizer along the y-axis ensures the NMR module is touching the side of the wellbore, and the resulting applied magnetic field gradient $G_y$ is along the y-axis.

Figure 12:
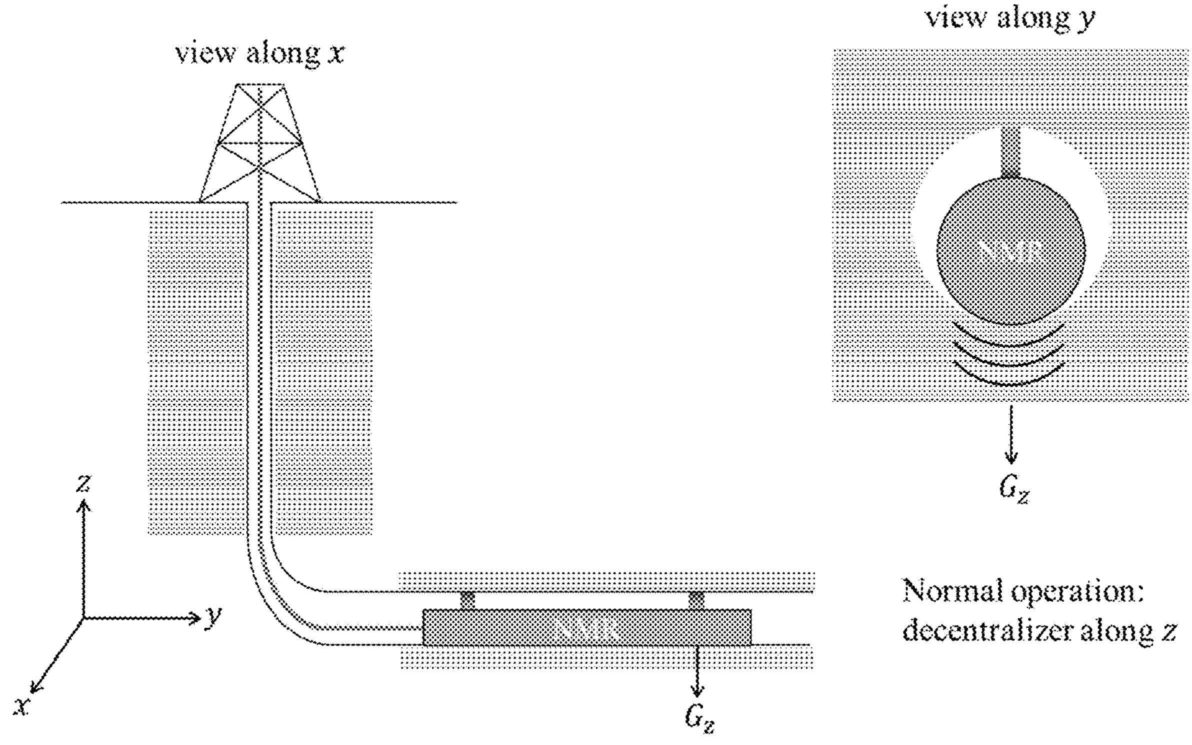
FIG. 12 shows a schematic for measuring $k_{\perp}$ logs in a horizontal well, according to embodiments of the present invention.

FIG. 12 shows how an NMR tool measures D-$T_2$ logs in a horizontal well to obtain the permeability perpendicular to bedding ($k_{\perp}$). The tool's decentralizer along the z-axis ensures the NMR module is touching the low side of the wellbore, and the resulting applied magnetic field gradient $G_z$ is along the z-axis. Note when used in a horizontal well, the wireline tool would require drill pipe, a.k.a. TLC (tough logging conditions).

Figure 13:
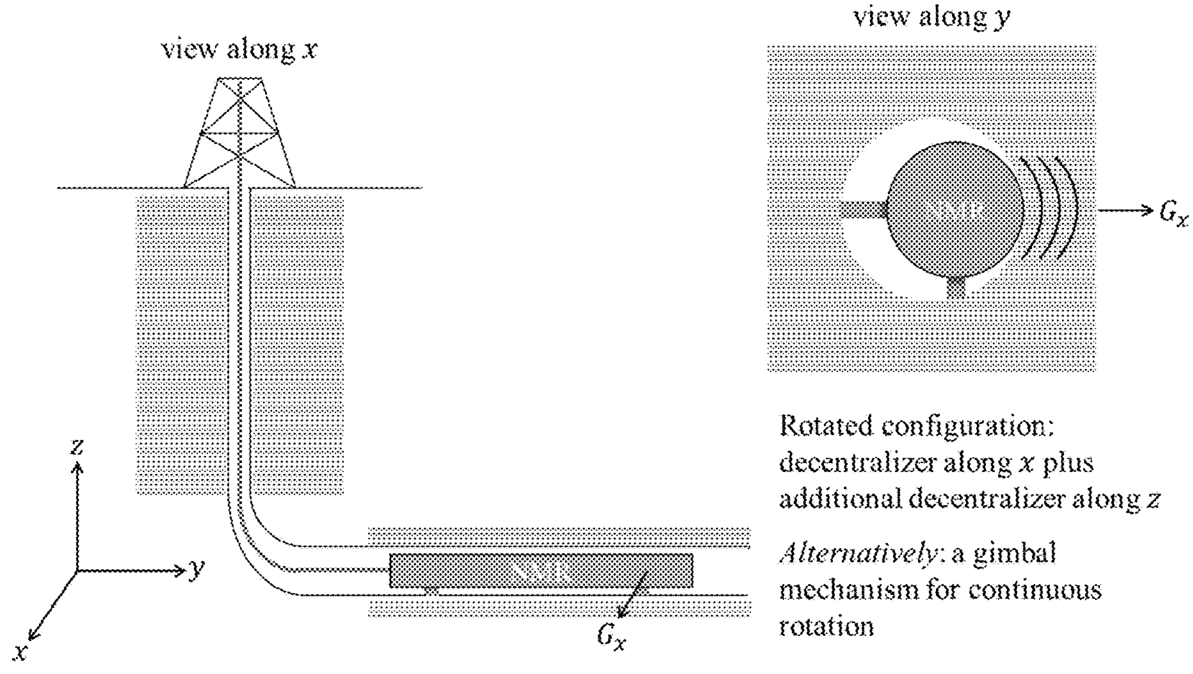
FIG. 13 shows a schematic for measuring $k_{\|}$ logs in a horizontal well, according to embodiments of the present invention.

In general, the spatial permeability variations between the vertical and horizontal wells will be greater due to permeability anisotropy. In order to address this, FIG. 13 shows how an NMR tool measures D-$T_2$ logs in a horizontal well to obtain the permeability parallel to bedding ($k_{\parallel}$), i.e., from the same horizontal well used to determine ($k_{\perp}$). The tool's main decentralizer is now along the x-axis, with an additional smaller decentralizer along the z-axis, ensures the NMR module is touching the x-axis side of the wellbore, and the resulting applied magnetic field gradient $G_x$ is along the x-axis. Alternatively, there could be a gimbal mechanism which rotates the tool as it gets pushed into the horizontal well.

Figure 14:
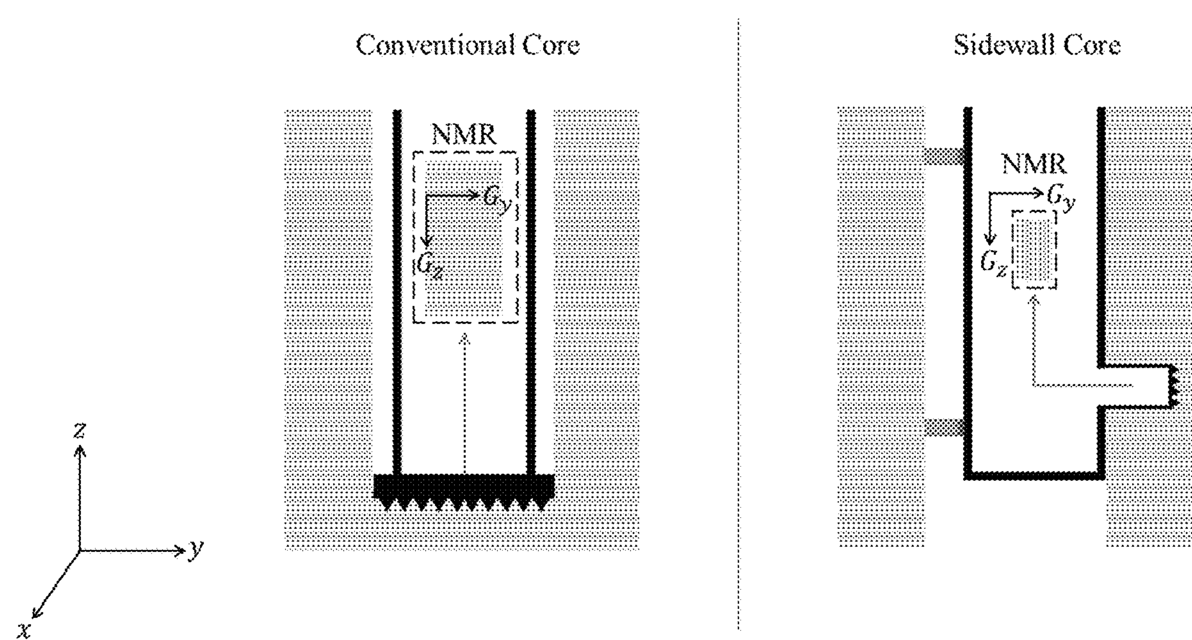
FIG. 14 shows a schematic for measuring $k_\perp$ and $k_\parallel$ downhole using a coring tool with in-situ NMR gradients, according to embodiments of the present invention.

Alternatively, FIG. 14 shows how an NMR coring tool in a vertical well alone can replace the NMR logging tool. The NMR coring tool can be either conventional core or sidewall core, with a D-$T_2$ module capable of two orientations ($G_z$ and $G_y$) of the applied magnetic-field gradient. The proposed NMR coring tool measures the cores in the preserved state, i.e., without ever dropping pressure or temperature of the reservoir. This implies D-$T_2$ in the coring tool will be identical to the D-$T_2$ log, provided there is no difference in mud invasion between core and log. The potential advantages of the coring tool are a horizontal well is not required, and the signal-to-noise SNR will be higher.

REFERENCES

Abed, A. M., 2013, The Eastern Mediterranean Phosphorite Giants: An Interplay Between Tectonics and Upwelling, *Geoarabia-Manama,* 18 (2), 67-94. DOI: 10.2113/geoarabia180267.

Almogi-Labin, A., Flexer, A., Honigstein, A., Rosenfeld, A., Rosenthal, E., 1990, Biostratigraphy and Tectonically Controlled Sedimentation of the Maastrichtian in Israel and Adjacent Countries. *Revista Espanola de Paleontologia,* 5 (1990), 41-52. DOI: 10.7203/sjp.25117.

Almogi-Labin, A., Bein, A., Sass, E., 1993, Late Cretaceous Upwelling System Along the Southern Tethys Margin (Israel): Interrelationship Between Productivity, Bottom Water Environments, and Organic Matter Preservation. *Paleoceanography,* 8 (1993), 671-690. DOI: 10.1029/93PA02197.

Carman, P. C., 1997, Fluid flow through granular beds. *Process Safety and Environmental Protection: Transactions of the Institution of Chemical Engineers, Part B.,* 75, S32-S48. DOI: 10.1016/S0263-8762 (97) 80003-2.

Chen, Z., Singer, P. M., Wang, X., Hirasaki, G. J., Vinegar, H. J., 2019a, Evaluation of Light Hydrocarbon Composition, Pore Size, and Tortuosity in Organic-Rich Chalks using NMR Core Analysis and Logging, Paper SPWLA-2019-K, *SPWLA $60^{th}$ Annual Logging Symposium,* The Woodlands, Texas, USA, 15-19 June. DOI: 10.30632/$T_{60}$ALS-2019_K.

Chen, Z., Singer, P. M., Wang, X., Vinegar, H. J., Nguyen, S. V., Hirasaki, G. J., 2019b, NMR Evaluation of Light-Hydrocarbon Composition, Pore Size, and Tortuosity in Organic-Rich Chalks, *Petrophysics,* 60 (06), 771-797. DOI: 10.30632/PJV60N6-2019a5.

Chen, J.-H., Stacey Althaus, S., Boudjatit, M., 2022, Optimization of NMR Permeability Transform and Application to a Source Rock Reservoir, Paper IPTC-22195-EA, *International Petroleum Technology Conference,* Riyadh, Saudi Arabia, February. DOI: 10.2523/IPTC-22195-EA.

Cheng, Y., Chen, S., Sandor, M., Shao, W., 2022, Reservoir formation characterization from NMR $T_1/T_2$ ratio, U.S. Pat. No. 11,280,931 B2, Mar. 22, 2022.

Coates G. R., Miller, M., Gillen, M., Henderson, C., 1991, The MRIL in Conoco 33-1 an Investigation of a New Magnetic Resonance Imaging Log, Paper SPWLA-1991-DD, *SPWLA* $32^{nd}$ *Annual Logging Symposium*, Midland, Texas, USA, June.

Cobb, K. M., Westphal, N. Sayani, H. R., Watson, J. T., Di Lorenzo, E., Cheng, H., Edwards, R. L., and Charles, C. D., 2013, Highly Variable El Niño-Southern Oscillation Throughout the Holocene. *Science,* 339 (6115), 67-70. DOI: 10.1126/science.1228246.

Dang, S., Mukherjee, S., Sondergeld, C., Rai, C., 2021, Measurement of Effective Tortuosity in Unconventional Tight Rock using Nuclear Magnetic Resonance, SPE/AAPG/SEG *Unconventional Resources Technology Conference*, URTEC-2021-5118-MS.

Dullien, F. A. L., 1979, *Porous Media Fluid Transport and Pore Structure*, Academic Press, ISBN: 978-0122236501.

Elsayed, M., El-Husseiny, A., Kwak, H., Hussaini, S. R., Mahmoud, M., 2021, New Technique for Evaluating Fracture Geometry and Preferential Orientation Using Pulsed Field Gradient Nuclear Magnetic Resonance, Paper SPE-205505-PA, *Society of Petroleum Engineers, SPE Journal,* 26 (05), 2880-2893. DOI: 10.2118/205505-PA.

Gordin, Y., Bradley, T., Rosenberg, Y. O., Canning, A., Hatzor, Y. H., Vinegar, H. J., 2021, Relating Acoustic Anisotropy to Kerogen Content in Unconventional Formations-A Case Study in a Kerogen-Rich Unconventional Carbonate, Paper SPE-205912-MS, 2021 *SPE Annual Technical Conference and Exhibition*, Dubai, UAE, 21-23 September. DOI: 10.2118/205912-MS.

Hughen, K. A., Schrag, D. P., Jacobsen, S. B., and Hantoro, W., 1999, El Niño During the Last Interglacial Period Recorded by a Fossil Coral from Indonesia. *Geophysical Research Letters,* 26 (20), 3129-3132. DOI: 10.1029/1999GL006062.

Jochum, M., Yeager, S. G., Lindsay, K., Moore, K., and Murtugudde, R., 2010, Quantification of the Feedback Between Phytoplankton and ENSO in the Community Climate System Model. *Journal of Climate,* 23 (11), 2916-2925. DOI: 10.1175/2010JCLI3254.1.

Kenyon, W. E., Day, P. I., Straley, C., Willemsen, J. F., 1988, A three-part study of NMR longitudinal relaxation properties of water-saturated sandstones. SPE-15643-PA, *SPE Form Eval,* 3 (03), 622-636. DOI: 10.2118/15643-PA.

Latour, L. L., Mitra, P. P., Kleinberg, R. L., Sotak, C. H., 1993, Time-Dependent Diffusion Coefficient of Fluids in Porous Media as a Probe of Surface-to-Volume Ratio, *Journal of Magnetic Resonance, Series A,* 101 (3), 342-346. DOI: 10.1006/jmra.1993.1056.

Li, Q.; Kortunov, P.; Messner, M.; Ertas, D.; King, H., 2022, Fluid Transport Mechanisms in Unconventional Tight Rocks Based on NMR Imaging, *Energy Fuels,* 36, 9014-9021.

Liu, Y., Wang, X., Hirasaki, G. J., Vinegar, E. V., Vinegar, H.,G., Singer, P. M., 2023, Separation of Solid and Liquid Components in Organic-Rich Chalks Using NMR Relaxation, *Fuel,* 333, 126223.

Lo, S., Hirasaki, G. J., House, W. V., Kobayashi, R., 2002, Mixing Rules and Correlations of NMR Relaxation Time with Viscosity, Diffusivity, and Gas/Oil Ratio of Methane/Hydrocarbon Mixtures, *SPE Journal,* 7 (01), 24-34. DOI: 10.2118/77264.

Meilijson. A., Ashckenazi-Polivoda, S., Ron-Yankovich, L., Illner, P., Alsenz, H., Speijer, R. P., Almogi-Labin, A., Feinstein, S., Berner, Z., Puttmann, W., Abramovich, S., 2014, Chronostratigraphy of the Upper Cretaceous High Productivity Sequence of the Southern Tethys, Israel. *Cretaceous Research,* 50 (4), 187-213. DOI: 10.1016/j.cretres.2014.04.006.

Meilijson. A., Ashckenazi-Polivoda, S., Illner, P., Speijer, R. P., Almogi-Labin, A., Feinstein, S., Puttmann, W., Abramovich, S., 2018, From Phytoplankton to Oil Shale Reservoirs: A 19-Million-Year Record of the Late Cretaceous Tethyan Upwelling Regime in the Levant Basin. *Marine and Petroleum Geology,* 95 (0264-8172), 188-205. DOI: 10.1016/j.marpetgeo.2018.04.012.

Scholes, O. N., Clayton, S. A., Hoadley, A. F. A., Tiu, C., 2007, Permeability anisotropy due to consolidation of compressible porous media, *Transport in Porous Media,* 68, 365-387. DOI: 10.1007/S11242-006-9048-5.

Shute, A., Kampf, J., Doubell, M., Rodriguez, A. R., Moller, L., Baring, R., and Newman, M., 2022, Variability of Surface and Subsurface Phytoplankton Blooms in a Seasonal Coastal Upwelling System. Continental *Shelf Research,* 246, 104832. DOI: 10.1016/j.csr.2022.104832.

Storebø, E. M., Meireles, L. T. P., Fabricius, I. L., 2022, Permeability Modeling in Clay-Rich Carbonate Reservoir, *Petrophysics,* 63 (2), 148-171. DOI: 10.30632/PJV63N2-2022a2.

Timur, R., 1969, Pulsed nuclear magnetic resonance studies of porosity, movable fluid, and permeability of sandstones, Paper SPE-2045-PA, *Journal of Petroleum Technology,* 21 (06), 775-786. DOI: 10.2118/2045-PA.

Venkataramanan, L., Song, Y., Hurlimann, M. D., 2002, Solving Fredholm Integrals of the First Kind with Tensor Product Structure in 2 and 2.5 Dimensions, *IEEE Transactions on Signal Processing,* 50 (5), 1017-1026. DOI: 10.1109/78.995059.

Vinegar, E. G., Rosenberg, Y. O., Reznick, I., Gordin, Y., Singer, P. M., Wang, X., Chen, Z., Nguyen, S. V., Li, W., Bradley, T., Hirasaki, G. J., Lake, L. W., Feinstein, S., Hatzor, Y. H., Vinegar, H. J., 2020a, What Happens to the Petrophysical Properties of a Dual Porosity Organic-Rich Chalk During Early-Stage Organic Maturation?, Paper SPWLA-5092, *SPWLA* $61^{st}$ *Annual Logging Symposium*, Virtual Online Webinar, June. DOI: 10.30632/SPWLA-5092.

Vinegar, E., Singer, P. M., Hirasaki, G. J., Chen, Z., Wang, X., Vinegar, H. J., 2020b, Determination of fluid-phase-specific petrophysical properties of geological core for oil, water and gas phases, U.S. Application 63/005,482, Apr. 6, 2020.

Vinegar, H. J., Singer, P. M., Hirasaki, G. J., Chen, Z., Wang, X., Vinegar, E., 2020c, New method of estimating permeability using NMR diffusion measurements, U. S. Application 63/005,482, Apr. 6, 2020.

Vinegar, H. J., Singer, P. M., Hirasaki, G. J., Chen, Z., Wang, X., 2021 Method for determining the composition of natural gas liquids, mean pore-size and tortuosity in a subsurface formation using NMR, U.S. Pat. No. 11,099,292, Aug. 24, 2021.

Wang, X., Singer, P. M., Chen, Z., Hirasaki, G. J., Vinegar, H. J., 2020, A New Method of Estimating Tortuosity and Pore Size in Unconventional Formations using NMR Restricted Diffusion Measurements, Paper SPWLA-5046, *SPWLA* $61^{st}$ *Annual Logging Symposium*, Virtual Online Webinar, June. DOI: 10.30632/SPWLA-5046.

Wang, X., Singer, P. M., Liu, Y., Chen, Z., Hirasaki, G. J., Vinegar, H. J., 2021a, Pore Size, Tortuosity, and Permeability from NMR Restricted Diffusion in Organic-Rich Chalks, *Petrophysics,* 62 (3), 244-264. DOI: 10.30632/PJV62N3-2021a1.

Wang, X., Singer, P. M., Liu, Y., Chen, Z., Hirasaki, G. J., Yang, Z. Seltzer, S. J., Sun, B., Wigand, M. O., Burger, J. E., 2021b, Permeability from NMR in the Unconventional Point-Pleasant Formation, Paper URTEC-2021-5015-MS, SPE/AAPG/SEG *Unconventional Resources Technology Conference*, Houston, TX, USA, July. DOI: 10.15530/urtec-2021-5015.

Zhang, Z., Weller, A., 2021, A comparative study of permeability prediction for Eocene sandstones—Part 1: Application of modified Swanson models to mercury injection capillary pressure and nuclear magnetic resonance data, *GEOPHYSICS,* 86 (6), 233-243. DOI: 10.1190/geo2021-0194.1.

The invention claimed is:

1. A method of estimating paleo-depositional cycles in a geological formation, the method comprising:

a. obtaining 1H nuclear magnetic resonance (NMR) measurements of restricted diffusion of a protonated fluid in a direction perpendicular to a bedding plane in a core sample aligned in the perpendicular direction and removed from the geological formation;

b. estimating diffusive tortuosity from the restricted diffusion measurements;

c. ascertaining a diffusion length at which the restricted diffusion in the core sample reaches a tortuosity limit; and d. calculating an average spacing between sedimentary boundaries of restricted diffusion.

2. The method of claim 1, additionally comprising: estimating a duration of an average paleo-depositional cycle based on the calculated average spacing between sedimentary boundaries of restricted diffusion and an estimated sedimentary depositional rate.

3. The method of claim 2 wherein the sedimentary deposition rate is based on an age-depth plot of the geological formation.

4. The method of claim 3 wherein the age-depth plot can be obtained from radioactivity, paleomagnetic and/or bio stratigraphic data obtained from core or well logs.

5. The method of claim 2, additionally comprising: comparing the estimated duration of the paleo-depositional cycles to present-day climate cycles.

6. The method of claim 5, additionally comprising: determining a change between the estimated duration of the paleo-depositional cycles to present-day climate cycles.

7. The method of claim 5, wherein the present-day climate cycles are an average of ENSO cycles dating back to 1850.

8. The method of claim 1, wherein the calculating of the average spacing between sedimentary boundaries of restricted diffusion includes multiplying, by a constant, the ascertained diffusion length at which the tortuosity limit is reached.

9. The method of claim 8, wherein the constant is between 1.5 and 2.5.

10. The method of claim 8, wherein the constant is between 1.8 and 2.2.

11. The method of claim 1, wherein the estimating of diffusive tortuosity includes using a Padé fit.

12. The method of claim 1, wherein the sedimentary boundaries of restricted diffusion comprise organic-rich layers and layers of accumulated shell fragments.

* * * * *